United States Patent
Yu et al.

(10) Patent No.: US 8,037,234 B2
(45) Date of Patent: *Oct. 11, 2011

(54) COMMAND QUEUING SMART STORAGE TRANSFER MANAGER FOR STRIPING DATA TO RAW-NAND FLASH MODULES

(75) Inventors: Frank Yu, Palo Alto, CA (US); Charles C. Lee, Cupertino, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 513 days.

This patent is subject to a terminal disclaimer.

(21) Appl. No.: 12/252,155

(22) Filed: Oct. 15, 2008

(65) Prior Publication Data

US 2009/0037652 A1   Feb. 5, 2009

Related U.S. Application Data

(63) Continuation-in-part of application No. 12/054,310, filed on Mar. 24, 2008, now Pat. No. 7,877,542, and a continuation-in-part of application No. 10/707,277, filed on Dec. 2, 2003, now Pat. No. 7,103,684, and a continuation-in-part of application No. 12/035,398, filed on Feb. 21, 2008, and a continuation-in-part of application No. 11/770,642, filed on Jun. 28, 2007, now Pat. No. 7,889,544, and a continuation-in-part of application No. 11/748,595, filed on May 15, 2007, now Pat. No. 7,471,556, and a continuation-in-part of application No. 11/871,011, filed on Oct. 11, 2007, now Pat. No. 7,934,074, and a continuation-in-part of application No. 11/458,987, filed on Jul. 20, 2006, now Pat. No. 7,690,030, and a continuation-in-part of application No. 10/818,653, filed on Apr. 5, 2004, now Pat. No. 7,243,185, and a continuation-in-part of application No. 12/128,916, filed on May 29, 2008, now Pat. No. 7,552,251, and a continuation-in-part of application No. 10/761,853, filed on Jan. 20, 2004, now abandoned, and a continuation-in-part of application No. 11/871,627, filed on Oct. 12, 2007, and a continuation-in-part of application No. 11/309,594, filed on Aug. 28, 2006, now Pat. No. 7,383,362, and a continuation-in-part of application No. 12/186,471, filed on Aug. 5, 2008.

(51) Int. Cl.
*G06F 12/00* (2006.01)
*G06F 13/00* (2006.01)
*G06F 13/28* (2006.01)

(52) U.S. Cl. .................... 711/103; 711/E12.008

(58) Field of Classification Search ................ 711/103, 711/E12.008
See application file for complete search history.

(56) References Cited

U.S. PATENT DOCUMENTS 5,680,579 A * 10/1997 Young et al. ............. 711/157
(Continued)

*Primary Examiner* — Sheng-Jen Tsai
(74) *Attorney, Agent, or Firm* — Stuart T. Auvinen; gPatent LLC

(57) ABSTRACT

A flash module has raw-NAND flash memory chips accessed over a physical-block address (PBA) bus by a NVM controller. The NVM controller is on the flash module or on a system board for a solid-state disk (SSD). The NVM controller converts logical block addresses (LBA) to physical block addresses (PBA). Data striping and interleaving among multiple channels of the flash modules is controlled at a high level by a smart storage transaction manager, while further interleaving and remapping within a channel may be performed by the NVM controllers. A SDRAM buffer is used by a smart storage switch to cache host data before writing to flash memory. A Q-R pointer table stores quotients and remainders of division of the host address. The remainder points to a location of the host data in the SDRAM. A command queue stores Q, R for host commands.

16 Claims, 24 Drawing Sheets

U.S. PATENT DOCUMENTS

| | | | |
|---|---|---|---|
| 5,905,993 A | 5/1999 | Shinohara | |
| 6,721,843 B1 | 4/2004 | Estakhri | |
| 6,772,274 B1 | 8/2004 | Estakhri | |
| 6,845,438 B1* | 1/2005 | Tanaka et al. | 711/206 |
| 7,073,010 B2 | 7/2006 | Chen et al. | |
| 7,155,559 B1* | 12/2006 | Estakhri et al. | 711/103 |
| 7,194,596 B2 | 3/2007 | Wu et al. | |
| 7,263,591 B2 | 8/2007 | Estakhri et al. | |
| 7,397,713 B2* | 7/2008 | Harari et al. | 365/200 |
| 2004/0186946 A1* | 9/2004 | Lee | 711/103 |
| 2007/0083697 A1 | 4/2007 | Birrell et al. | |
| 2008/0028131 A1 | 1/2008 | Kudo et al. | |
| 2008/0028165 A1 | 1/2008 | Sukegawa | |
| 2008/0098164 A1* | 4/2008 | Lee et al. | 711/103 |
| 2008/0155160 A1 | 6/2008 | McDaniel | |
| 2008/0155177 A1 | 6/2008 | Sinclair et al. | |
| 2008/0155182 A1 | 6/2008 | Kudo | |
| 2008/0162792 A1 | 7/2008 | Wu et al. | |
| 2008/0162793 A1 | 7/2008 | Chu et al. | |
| 2008/0320214 A1* | 12/2008 | Ma et al. | 711/103 |
| 2009/0193184 A1* | 7/2009 | Yu et al. | 711/103 |
| 2009/0204872 A1* | 8/2009 | Yu et al. | 714/773 |

* cited by examiner

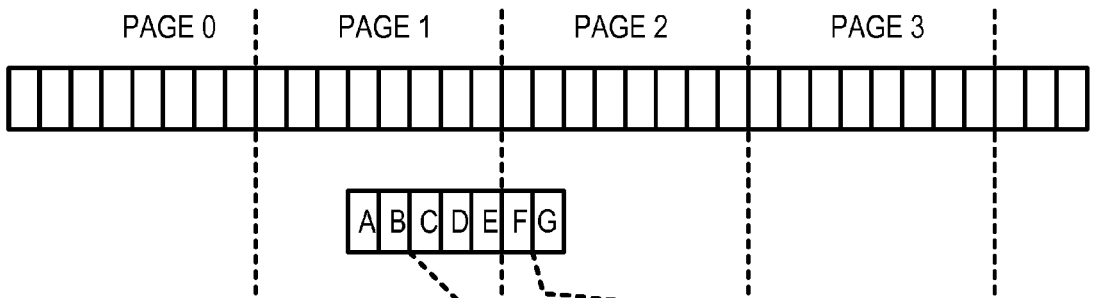
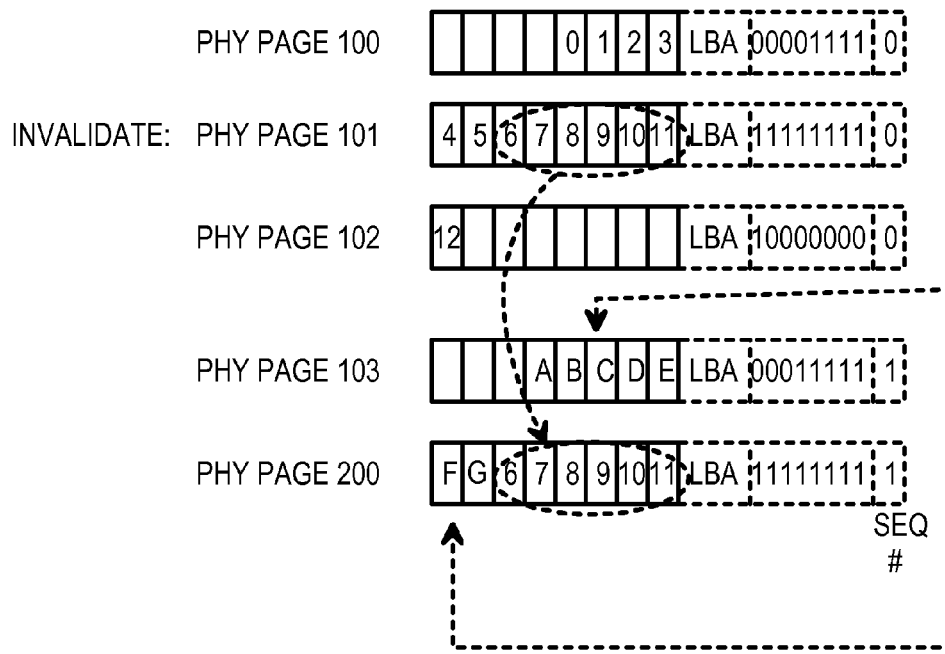
FIG. 15

CMD QUEUE 230

| LBA | LEN | Q | R | X | DT |
|-----|-----|---|---|---|----|
| 0   | 0   | 0 | 0 | 0 | 00 |
| 0   | 0   | 0 | 0 | 0 | 00 |
| 0   | 0   | 0 | 0 | 0 | 00 |
| 0   | 0   | 0 | 0 | 0 | 00 |
| 0   | 0   | 0 | 0 | 0 | 00 |

SDRAM BUFFER 60

| 0  | 1  | 2  | 3  |
|----|----|----|----|
| 4  | 5  | 6  | 7  |
| 8  | 9  | 10 | 11 |
| 12 | 13 | 14 | 15 |

FIG. 16A

WRITE C0, LBA=1, LEN=3

CMD QUEUE 230

|    | LBA | LEN | Q | R | X | DT |
|----|-----|-----|---|---|---|----|
| C0 | 1   | 3   | 0 | 1 | 0 | 10 |
|    | 0   | 0   | 0 | 0 | 0 | 00 |
|    | 0   | 0   | 0 | 0 | 0 | 00 |
|    | 0   | 0   | 0 | 0 | 0 | 00 |
|    | 0   | 0   | 0 | 0 | 0 | 00 |

SDRAM BUFFER 60

| 0  | C0 | C0 | C0 |
|----|----|----|----|
| 4  | 5  | 6  | 7  |
| 8  | 9  | 10 | 11 |
| 12 | 13 | 14 | 15 |

FIG. 16B

WRITE C1, LBA=5, LEN=1

CMD QUEUE 230

|    | LBA | LEN | Q | R | X | DT |
|----|-----|-----|---|---|---|----|
| C0 | 1   | 3   | 0 | 1 | 0 | 10 |
| C1 | 5   | 1   | 0 | 5 | 0 | 10 |
|    | 0   | 0   | 0 | 0 | 0 | 00 |
|    | 0   | 0   | 0 | 0 | 0 | 00 |
|    | 0   | 0   | 0 | 0 | 0 | 00 |

SDRAM BUFFER 60

| 0  | C0 | C0 | C0 |
|----|----|----|----|
| 4  | C1 | 6  | 7  |
| 8  | 9  | 10 | 11 |
| 12 | 13 | 14 | 15 |

FIG. 16C

COMMAND QUEUING SMART STORAGE TRANSFER MANAGER FOR STRIPING DATA TO RAW-NAND FLASH MODULES

RELATED APPLICATIONS

This application is a continuation-in-part (CIP) of "Multi-Level Controller with Smart Storage Transfer Manager for Interleaving Multiple Single-Chip Flash Memory Devices", U.S. Ser. No. 12/186,471, filed Aug. 5, 2008, which is a CIP of "High Integration of Intelligent Non-Volatile Memory Devices", Ser. No. 12/054,310, filed Mar. 24, 2008, which is a CIP of "High Endurance Non-Volatile Memory Devices", Ser. No. 12/035,398, filed Feb. 21, 2008, which is a CIP of "High Speed Controller for Phase Change Memory Peripheral Devices", U.S. application Ser. No. 11/770,642, filed on Jun. 28, 2007, which is a CIP of "Local Bank Write Buffers for Acceleration a Phase Change Memory", U.S. application Ser. No. 11/748,595, filed May 15, 2007, which is CIP of "Flash Memory System with a High Speed Flash Controller", application Ser. No. 10/818,653, filed Apr. 5, 2004, now U.S. Pat. No. 7,243,185.

This application is also a CIP of co-pending U.S. patent application for "Multi-Channel Flash Module with Plane-Interleaved Sequential ECC Writes and Background Recycling to Restricted-write Flash Chips", Ser. No. 11/871,627, filed Oct. 12, 2007, and is also a CIP of "Flash Module with Plane-Interleaved Sequential Writes to Restricted-Write Flash Chips", Ser. No. 11/871,011, filed Oct. 11, 2007.

This application is a continuation-in-part (CIP) of co-pending U.S. patent application for "Single-Chip Multi-Media Card/Secure Digital controller Reading Power-on Boot Code from Integrated Flash Memory for User Storage", Ser. No. 12/128,916, filed on May 29, 2008, which is a continuation of U.S. patent application for "Single-Chip Multi-Media Card/Secure Digital controller Reading Power-on Boot Code from Integrated Flash Memory for User Storage", Ser. No. 11/309,594, filed on Aug. 28, 2006, now issued as U.S. Pat. No. 7,383,362, which is a CIP of U.S. patent application for "Single-Chip USB Controller Reading Power-On Boot Code from Integrated Flash Memory for User Storage", Ser. No. 10/707,277, filed on Dec. 2, 2003, now issued as U.S. Pat. No. 7,103,684.

This application is also a CIP of co-pending U.S. patent application for "Electronic Data Flash Card with Fingerprint Verification Capability", Ser. No. 11/458,987, filed Jul. 20, 2006, which is a CIP of U.S. patent application for "Highly Integrated Mass Storage Device with an Intelligent Flash Controller", Ser. No. 10/761,853, filed Jan. 20, 2004, now abandoned.

FIELD OF THE INVENTION

This invention relates to flash-memory solid-state-drive (SSD) devices, and more particularly to a smart storage switch connecting to multiple flash-memory endpoints.

BACKGROUND OF THE INVENTION

Host systems such as Personal Computers (PC's) store large amounts of data in mass-storage devices such as hard disk drives (HDD). Mass-storage devices are block-addressable rather than byte-addressable, since the smallest unit that can be read or written is a page that is several 512-byte sectors in size. Flash memory is replacing hard disks and optical disks as the preferred mass-storage medium.

NAND flash memory is a type of flash memory constructed from electrically-erasable programmable read-only memory (EEPROM) cells, which have floating gate transistors. These cells use quantum-mechanical tunnel injection for writing and tunnel release for erasing. NAND flash is non-volatile so it is ideal for portable devices storing data. NAND flash tends to be denser and less expensive than NOR flash memory.

However, NAND flash has limitations. In the flash memory cells, the data is stored in binary terms—as ones (1) and zeros (0). One limitation of NAND flash is that when storing data (writing to flash), the flash can only write from ones (1) to zeros (0). When writing from zeros (0) to ones (1), the flash needs to be erased a "block" at a time. Although the smallest unit for read can be a byte or a word within a page, the smallest unit for erase is a block.

Single Level Cell (SLC) flash and Multi Level Cell (MLC) flash are two types of NAND flash. The erase block size of SLC flash may be 128K+4K bytes while the erase block size of MLC flash may be 256K+8K bytes. Another limitation is that NAND flash memory has a finite number of erase cycles between 10,000 and 100,000, after which the flash wears out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash with the same technology. But the performance, reliability and durability may decrease for MLC flash.

A consumer may desire a large capacity flash-memory system, perhaps as a replacement for a hard disk. A solid-state disk (SSD) made from flash-memory chips has no moving parts and is thus more reliable than a rotating disk.

Several smaller flash drives could be connected together, such as by plugging many flash drives into a USB hub that is connected to one USB port on a host, but then these flash drives appear as separate drives to the host. For example, the host's operating system may assign each flash drive its own drive letter (D:, E:, F:, etc.) rather than aggregate them together as one logical drive, with one drive letter. A similar problem could occur with other bus protocols, such as Serial AT-Attachment (SATA), integrated device electronics (IDE), and Peripheral Components Interconnect Express (PCIe). The parent application, now U.S. Pat. No. 7,103,684, describes a single-chip controller that connects to several flash-memory mass-storage blocks.

Larger flash systems may use several channels to allow parallel access, improving performance. A wear-leveling algorithm allows the memory controller to remap logical addresses to different physical addresses so that data writes can be evenly distributed. Thus the wear-leveling algorithm extends the endurance of the MLC flash memory.

What is desired is a multi-channel flash system with flash memory on modules in each of the channels. A smart storage switch or hub is desired between the host and the multiple flash-memory modules so that data may be striped across the multiple channels of flash. It is desired that the smart storage switch interleaves and stripes data accesses to the multiple channels of flash-memory devices using a command queue that stores quotient and remainder pointers for data buffered in a SDRAM buffer.

BRIEF DESCRIPTION OF THE DRAWINGS

FIG. 15 highlights a non-aligned data merge.

FIG. 16A-K are examples of using a command queue with a SDRAM buffer in a flash-memory system.

DETAILED DESCRIPTION

The present invention relates to an improvement in solid-state flash drives. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
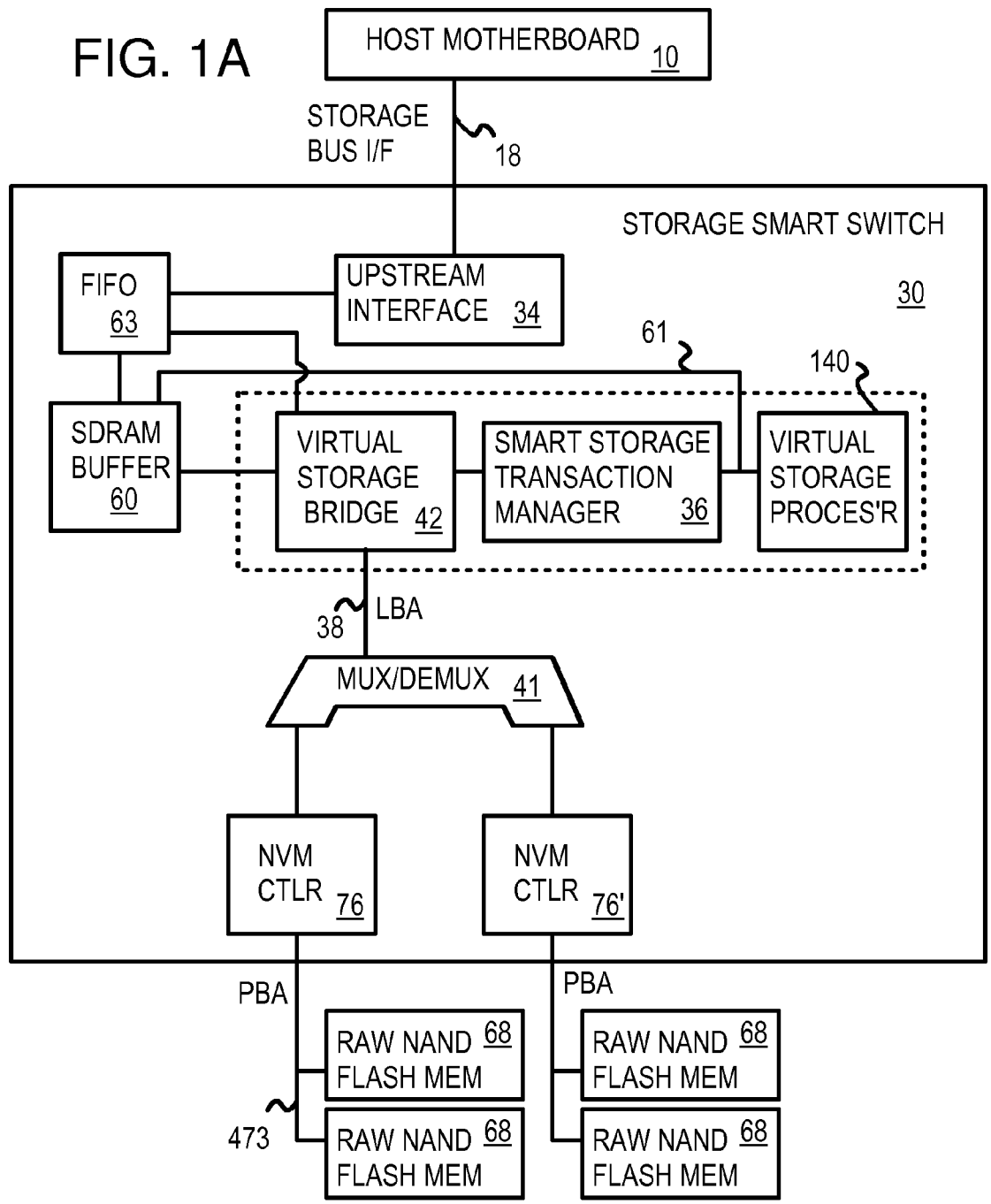
FIG. 1A shows a smart storage switch that connects to raw NAND flash-memory devices.

FIG. 1A shows a smart storage switch that connects to raw NAND flash-memory devices. Smart storage switch 30 connects to host storage bus 18 through upstream interface 34. Smart storage switch 30 also connects to raw-NAND flash memory chips 68 over a physical block address (PBA) bus 473. Transactions on logical block address (LBA) bus 38 from virtual storage bridge 42 are demuxed by mux/demux 41 and sent to one of NVM controllers 76, which convert LBA's to PBA's that are sent to raw-NAND flash memory chips 68. Each NVM controller 76 can have one or more channels.

NVM controllers 76 may act as protocol bridges that provide physical signaling, such as driving and receiving differential signals on any differential data lines of LBA bus 38, detecting or generating packet start or stop patterns, checking or generating checksums, and higher-level functions such as inserting or extracting device addresses and packet types and commands. The host address from host motherboard 10 contains a logical block address (LBA) that is sent over LBA bus 28, although this LBA may be remapped by smart storage switch 30 in some embodiments that perform two-levels of wear-leveling, bad-block management, etc.

Smart storage switch 30 may operate in single-endpoint mode. Smart storage switch 30 operates an aggregating and virtualizing switch.

Internal processor bus 61 allows data to flow to virtual storage processor 140 and SDRAM 60. Buffers in SDRAM 60 coupled to virtual storage bridge 42 can store the data. SDRAM 60 is a synchronous dynamic-random-access memory on smart storage switch 30. Alternately, SDRAM 60 buffer can be the storage space of a SDRAM memory module located on host motherboard 10, since normally SDRAM module capacity on the motherboard is much larger and can reduce the cost of smart storage switch 30. Also, the functions of smart storage switch 30 can be embedded in host motherboard 10 to further increase system storage efficiency due to a more powerful CPU and larger capacity SDRAM space that is usually located in the host motherboard. FIFO 63 may be used with SDRAM 60 to buffer packets to and from upstream interface 34 and virtual storage bridge 42.

Virtual storage processor 140 provides re-mapping services to smart storage transaction manager 36. For example, logical addresses from the host can be looked up and translated into logical block addresses (LBA) that are sent over LBA bus 38 to NVM controllers 76. Host data may be alternately assigned to NVM controllers 76 in an interleaved fashion by virtual storage processor 140 or by smart storage transaction manager 36. NVM controller 76 may then perform a lower-level interleaving among raw-NAND flash memory chips 68 within one or more channels. Thus interleaving may be performed on two levels, both at a higher level by smart storage transaction manager 36 among two or more NVM controllers 76, and within each NVM controller 76 among its raw-NAND flash memory chips 68.

NVM controller 76 performs logical-to-physical remapping as part of a flash translation layer function, which converts LBA's received on LBA bus 38 to PBA's that address actual non-volatile memory blocks in raw-NAND flash memory chips 68. NVM controller 76 may perform wear-leveling and bad-block remapping and other management functions at a lower level.

When operating in single-endpoint mode, smart storage transaction manager 36 not only buffers data using virtual storage bridge 42, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to NVM controllers 76 before completion of the first transaction. This allows more time for memory access to occur for the next transaction. Transactions are thus overlapped by re-ordering packets.

Packets sent over LBA bus 38 are re-ordered relative to the packet order on host storage bus 18. Transaction manager 36 may overlap and interleave transactions to different flash storage blocks, allowing for improved data throughput. For example, packets for several incoming host transactions are stored in SDRAM buffer 60 by virtual storage bridge 42 or an associated buffer (not shown). Transaction manager 36 examines these buffered transactions and packets and re-orders the packets before sending them over LBA bus 38 to a downstream flash storage block in one of raw-NAND flash memory chips 68.

Figure 1B:
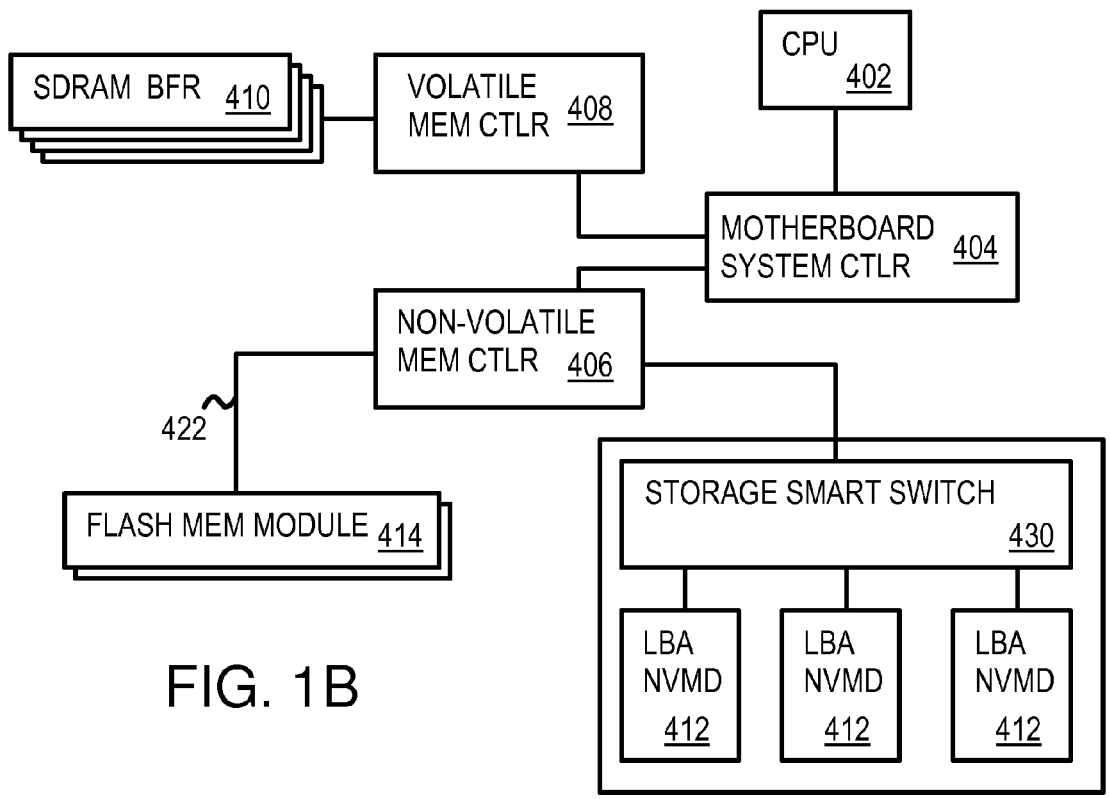
FIG. 1B shows a host system using flash modules.

FIG. 1B shows a host system using flash memories. Motherboard system controller 404 connects to Central Processing Unit (CPU) 402 over a front-side bus or other high-speed CPU bus. CPU 402 reads and writes SDRAM buffer 410, which is controlled by volatile memory controller 408. SDRAM buffer 410 may have several memory modules of DRAM chips.

Data from flash memory may be transferred to SDRAM buffer 410 by motherboard system controller using both volatile memory controller 408 and non-volatile memory controller 406. A direct-memory access (DMA) controller may be used for these transfers, or CPU 402 may be used. Non-volatile memory controller 406 may read and write to flash memory modules 414, or may access LBA-NVM devices 412 which are controlled by smart storage switch 430.

LBA-NVM devices 412 contain both NVM controller 76 and raw-NAND flash memory chips 68. NVM controller 76 converts LBA to PBA addresses. Smart storage switch 30 sends logical LBA addresses to LBA-NVM devices 412, while non-volatile memory controller 402 sends physical PBA addresses over physical bus 422 to flash modules 414. A host system may have only one type of NVM sub-system, either flash modules 414 or LBA-NVM devices 412, although both types could be present in some systems.

Figure 1C:
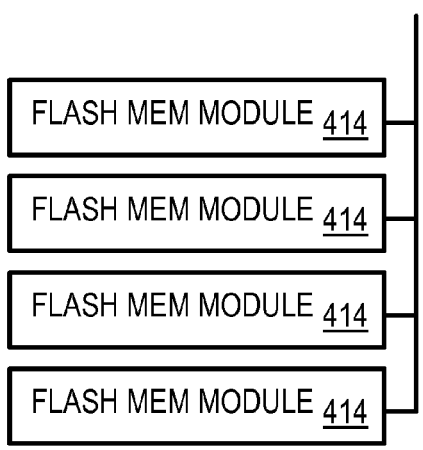
FIG. 1C shows flash modules arranged in parallel.
Figure 1D:
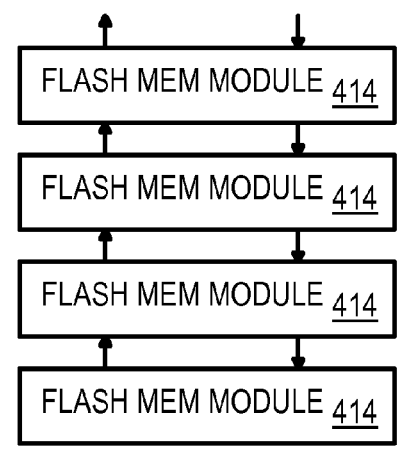
FIG. 1D shows flash modules arranged in series.

FIG. 1C shows that flash modules 414 of FIG. 1B may be arranged in parallel on a single segment of physical bus 422. FIG. 1D shows that flash modules 414 of FIG. 1B may be arranged in series on multiple segments of physical bus 422 that form a daisy chain.

Figure 2:
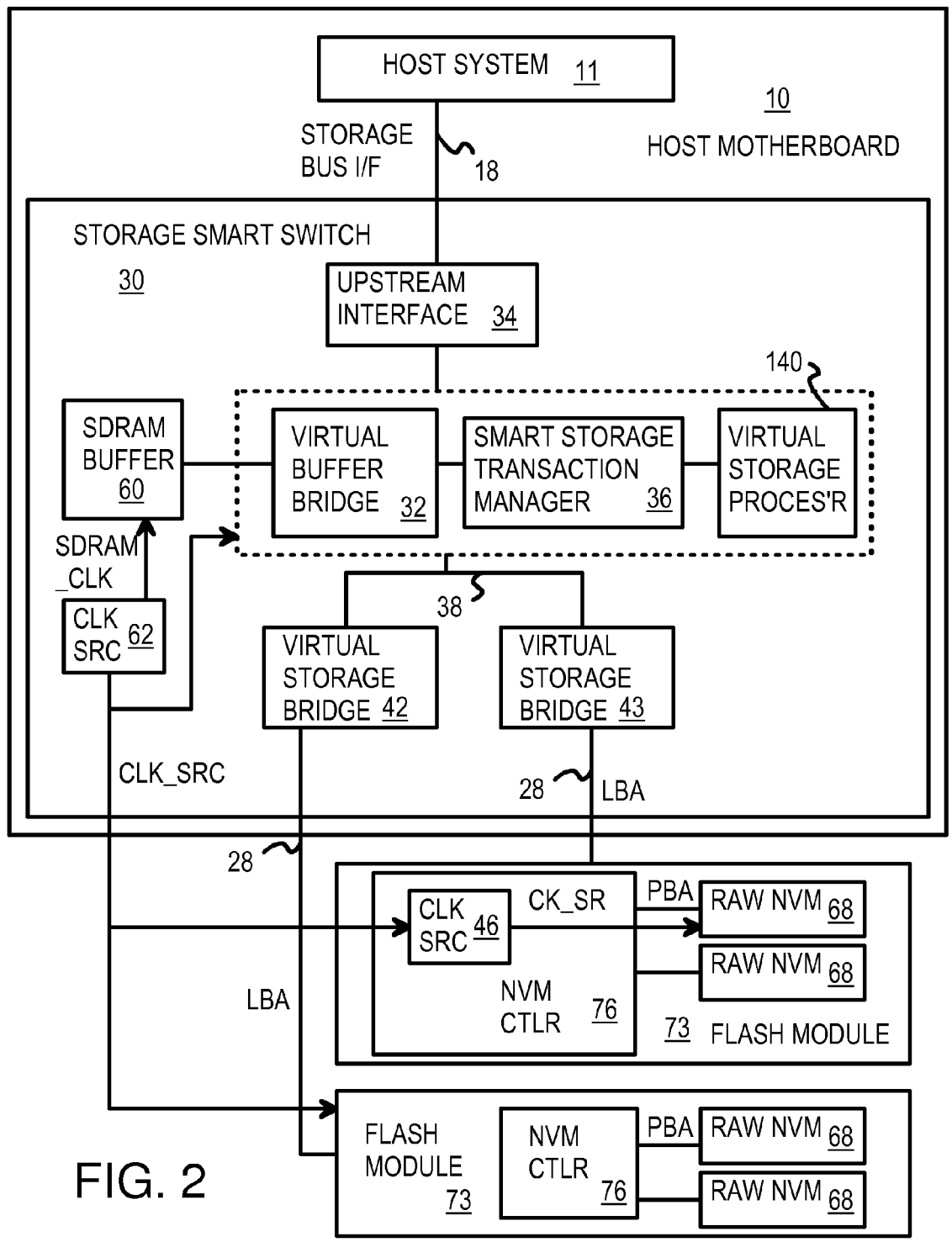
FIG. 2 shows a smart storage switch using flash memory modules with on-module NVM controllers.

FIG. 2 shows a smart storage switch using flash memory modules with on-module NVM controllers. Smart storage switch 30 connects to host system 11 over host storage bus 18 through upstream interface 34. Smart storage switch 30 also connects to downstream flash storage device over LBA buses 28 through virtual storage bridges 42, 43.

Virtual storage bridges 42, 43 are protocol bridges that also provide physical signaling, such as driving and receiving differential signals on any differential data lines of LBA buses 28, detecting or generating packet start or stop patterns, checking or generating checksums, and higher-level functions such as inserting or extracting device addresses and packet types and commands. The host address from host system 11 contains a logical block address (LBA) that is sent over LBA buses 28, although this LBA may be remapped by smart storage switch 30 in some embodiments that perform two-levels of wear-leveling, bad-block management, etc.

Buffers in SDRAM 60 coupled to virtual buffer bridge 32 can store the data. SDRAM 60 is a synchronous dynamic-random-access memory on smart storage switch 30. Alternately, SDRAM 60 buffer can be the storage space of a SDRAM memory module located in the host motherboard, since normally SDRAM module capacity on the motherboard is much larger and can save the cost of smart storage switch 30. Also, the functions of smart storage switch 30 can be embedded in the host motherboard to further increase system storage efficiency due to a more powerful CPU and larger capacity SDRAM space that is usually located in host motherboard 10.

Virtual storage processor 140 provides re-mapping services to smart storage transaction manager 36. For example, logical addresses from the host can be looked up and translated into logical block addresses (LBA) that are sent over LBA buses 28 to flash modules 73. Host data may be alternately assigned to flash modules 73 in an interleaved fashion by virtual storage processor 140 or by smart storage transaction manager 36. NVM controller 76 in each of flash modules 73 may then perform a lower-level interleaving among raw-NAND flash memory chips 68 within each flash module 73. Thus interleaving may be performed on two levels, both at a higher level by smart storage transaction manager 36 among two or more flash modules 73, and within each flash module 73 among raw-NAND flash memory chips 68 on the flash module.

NVM controller 76 performs logical-to-physical remapping as part of a flash translation layer function, which converts LBA's received on LBA buses 28 to PBA's that address actual non-volatile memory blocks in raw-NAND flash memory chips 68. NVM controller 76 may perform wear-leveling and bad-block remapping and other management functions at a lower level.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to flash modules 73 before completion of the first transaction. This allows more time for memory access to occur for the next transaction. Transactions are thus overlapped by re-ordering packets.

Packets sent over LBA buses 28 are re-ordered relative to the packet order on host storage bus 18. Transaction manager 36 may overlap and interleave transactions to different flash storage blocks, allowing for improved data throughput. For example, packets for several incoming host transactions are stored in SDRAM buffer 60 by virtual buffer bridge 32 or an associated buffer (not shown). Transaction manager 36 examines these buffered transactions and packets and re-orders the packets before sending them over internal bus 38 to a downstream flash storage block in one of flash modules 73.

A packet to begin a memory read of a flash block through bridge 43 may be re-ordered ahead of a packet ending a read of another flash block through bridge 42 to allow access to begin earlier for the second flash block.

Clock source 62 may generate a clock to SDRAM 60 and to smart storage transaction manager 36 and virtual storage processor 140 and other logic in smart storage switch 30. A clock from clock source 62 may also be sent from smart storage switch 30 to flash modules 73, which have an internal clock source 46 that generates an internal clock CK_SR that synchronizes transfers between NVM controller 76 and raw-NAND flash memory chips 68 within flash module 73. Thus the transfer of physical blocks and PBA are re-timed from the transfer of logical LBA's on LBA buses 28.

Figure 3A:
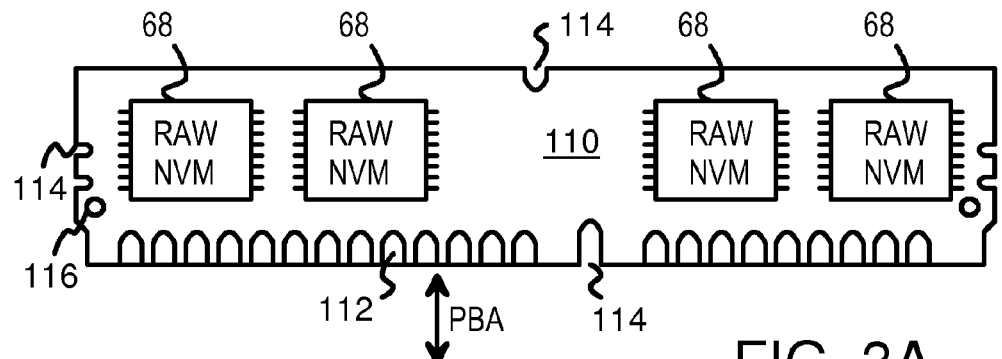
FIG. 3A shows a PBA flash module.

FIG. 3A shows a PBA flash module. Flash module 110 contains a substrate such as a multi-layer printed-circuit board (PCB) with surface-mounted raw-NAND flash memory chips 68 mounted to the front surface or side of the substrate, as shown, while more raw-NAND flash memory chips 68 are mounted to the back side or surface of the substrate (not shown).

Metal contact pads 112 are positioned along the bottom edge of the module on both front and back surfaces. Metal contact pads 112 mate with pads on a module socket to electrically connect the module to a PC motherboard. Holes 116 are present on some kinds of modules to ensure that the module is correctly positioned in the socket. Notches 114 also ensure correct insertion and alignment of the module. Notches 114 can prevent the wrong type of module from being inserted by mistake. Capacitors or other discrete components are surface-mounted on the substrate to filter noise from raw-NAND flash memory chips 68, which are also mounted using a surface-mount-technology SMT process.

Since flash module 110 connects raw-NAND flash memory chips 68 to metal contact pads 112, the connection to flash module 110 is through a PBA. Raw-NAND flash memory chips 68 of FIG. 1 could be replaced by flash module 110 of FIG. 3A.

Metal contact pads 112 form a connection to a flash controller, such as non-volatile memory controller 406 in FIG. 408. Metal contact pads 122 may form part of physical bus 422 of FIG. 1B. Metal contact pads 122 may alternately form part of bus 473 of FIG. 1A.

Figure 3B:
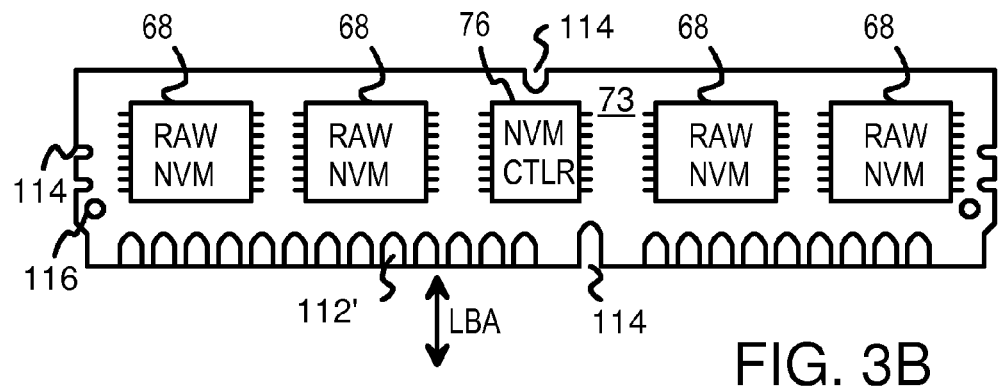
FIG. 3B shows a LBA flash module.

FIG. 3B shows a LBA flash module. Flash module 73 contains a substrate such as a multi-layer printed-circuit board (PCB) with surface-mounted raw-NAND flash memory chips 68 and NVM controller 76 mounted to the front surface or side of the substrate, as shown, while more raw-NAND flash memory chips 68 are mounted to the back side or surface of the substrate (not shown).

Metal contact pads 112' are positioned along the bottom edge of the module on both front and back surfaces. Metal contact pads 112' mate with pads on a module socket to electrically connect the module to a PC motherboard. Holes 116 are present on some kinds of modules to ensure that the module is correctly positioned in the socket. Notches 114 also ensure correct insertion of the module. Capacitors or other discrete components are surface-mounted on the substrate to filter noise from raw-NAND flash memory chips 68.

Since flash module 73 has NVM controller 76 mounted on it's substrate, raw-NAND flash memory chips 68 do not directly connect to metal contact pads 112'. Instead, raw-NAND flash memory chips 68 connect using wiring traces to NVM controller 76, then NVM controller 76 connects to metal contact pads 112'. The connection to flash module 73 is through a LBA bus from NVM controller 76, such as LBA bus 28 as shown in FIG. 2.

Figure 3C:
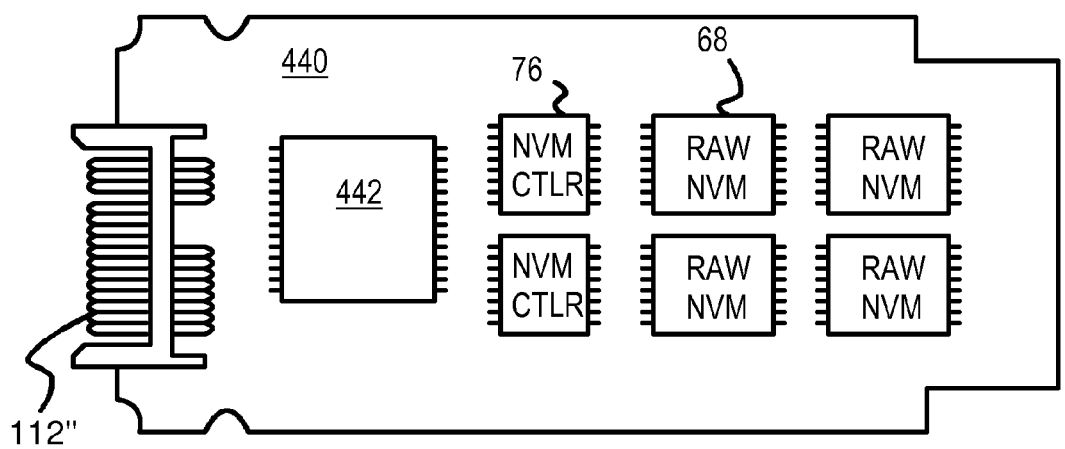
FIG. 3C shows a Solid-State-Disk (SSD) board.

FIG. 3C shows a Solid-State-Disk (SSD) board that can connect directly to a host. SSD board 440 has a connector 112" that plugs into a host motherboard, such as into host storage bus 18 of FIG. 1A. Connector 112" can carry a SATA, PATA, PCI Express, or other bus. NVM controllers 76 and raw-NAND flash memory chips 68 are soldered to SSD board 440. Other logic and buffers may be present in chip 442. Chip 422 can include smart storage switch 30 of FIG. 1A.

Alternately, connector 122" may form part of physical bus 422 of FIG. 1B. Rather than use raw-NAND flash memory chips 68, LBA-NAND flash memory chips may be used that receive logical addresses from the NVM controller.

FIGS. 4A-F show various arrangements of data stored in raw-NAND flash memory chips 68. Data from the host may be divided into stripes by striping logic 518 in FIG. 9 and stored in different flash modules 73, or in different raw-NAND flash memory chips 68 within one flash module 73 that act as endpoints. The host's Operating System writes or reads data files using a cluster (such as 4K Bytes in this example) as an address tracking mechanism. However during a real data transfer, it is based on a sector (512-Byte) unit. For two-level data-striping, smart storage switch 30 accounts for this when issuing to physical flash memory pages (the programming unit) and blocks (the erasing unit).

Figure 4A:
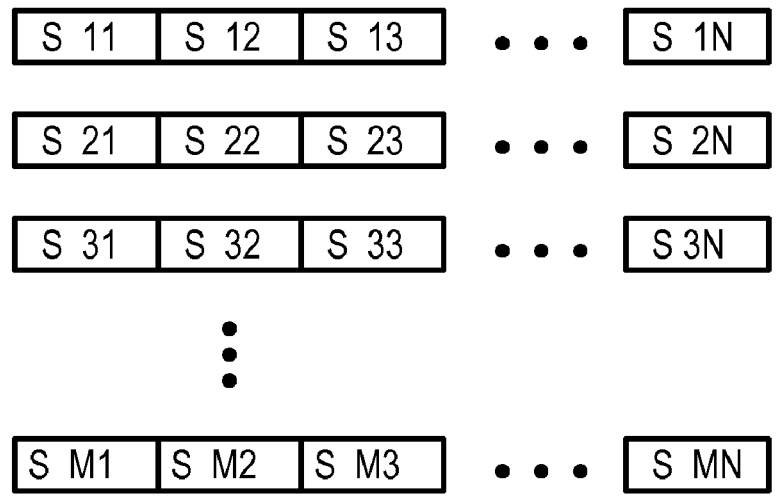
FIGS. 4A-F show various arrangements of data stored in raw-NAND flash memory chips 68.

FIG. 4A shows a N-way address interleave operation. The NVM controller sends host data in parallel to several channels or chips. For example, S11, S21, S31, SM1 can be data sent to one NVM controller or channel. N-way interleave can improve performance, since the host can send commands to one channel, and without waiting for the reply, the host can directly send more commands to second channel, etc.

In FIG. 4A, data is arranged in a conventional linear arrangement. The data sequence received from the host in this example is S11, S12, S13, ..., S1N, then S21, S22, S23, ..., S2N, with SMN as the last data. In an actual system, the LBA addresses may not start from S11. For example, S13 may be the first data item. The last data item may not end with SMN. For example. SM3 may be the last data item. Each N-token data item has four times as many pages as is stored in a memory location that is physically on one flash storage device, such as 4×2K, 4×4K, 4×8K etc. Details of each token's data item are described later. A total of M data items are stored, with some of the data items being stored on different flash storage devices. When a failure occurs, such as a flash-memory chip failing to return data, the entire data item is usually lost. However, other data items stored on other physical flash-memory chips can be read without errors.

Figure 4B:
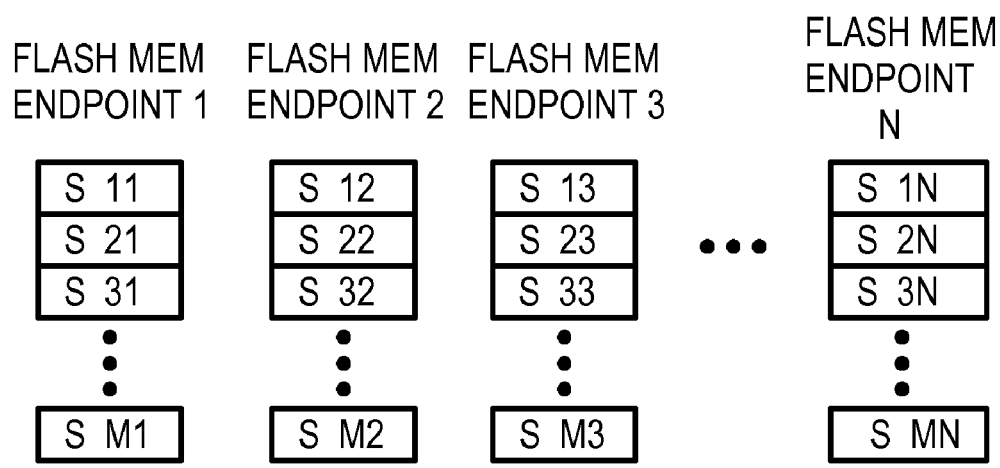

In FIG. 4B, data is striped across N flash-storage endpoints. Each data item is distributed and stored in the N flash-storage endpoints. For example, the first N-token data item consists of tokens S11, S12, S13, ... S1N. The data item has token S11 stored in endpoint 1, token S12 stored in endpoint 2, ..., and token S1N stored in endpoint N. Data items can fill up all endpoints before starting to fill the next round. These data items may be stripes that are sectors or pages, or are aligned to multiple sectors or multiple pages.

Figure 4C:
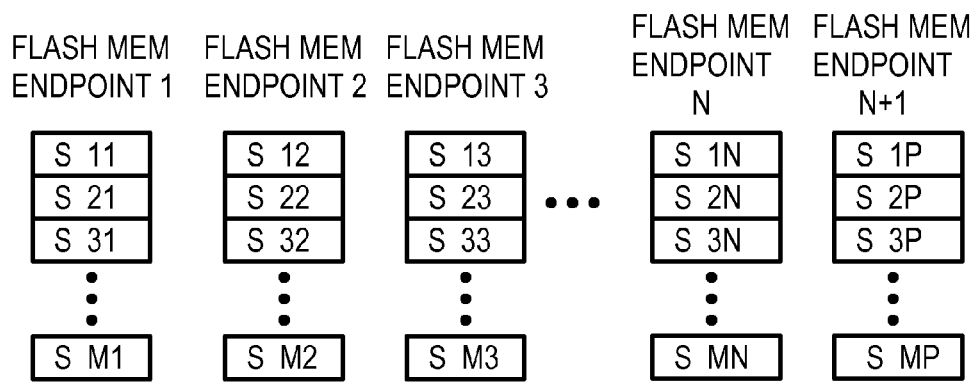

FIG. 4C is another approach for adding one particular channel or chip as parity or ECC overhead to protect against errors in one of the N endpoints. Each time the host controller reads results from the (N+1) channels and compares the results with the P parity value in the last channel to determine whether the results are correct. The Parity channel can also be used to revive the correct value if ECC coding techniques are used, which can include Reed-Solomon or BCH methods.

In FIG. 4C, data striping is performed across multiple storage endpoints with parity. The raw-NAND flash memory chips are partitioned into N+1 endpoints. The N+1 endpoints are equal size, and the parity endpoint N+1 is sufficiently large in size to hold parity or error-correcting code (ECC) for the other N endpoints.

Each data item is divided into N portions with each portion stored on a different one of the N endpoints. The parity or ECC for the data item is stored in the parity endpoint, which is the last endpoint, N+1. For example, an N-token data item consists of tokens S11, S12, S13, ... S1N. The data item has token S11 stored in endpoint 1, token S12 stored in endpoint 2, token S13 stored in endpoint 3, ... and token S1N stored in segment N. The parity or ECC is stored in the parity endpoint as token S1P.

In the diagram, each data item is stored across all endpoints as a horizontal stripe. If one endpoint device fails, most of the data item remains intact, allowing for recovery using the parity or ECC endpoint flash devices.

Figure 4D:
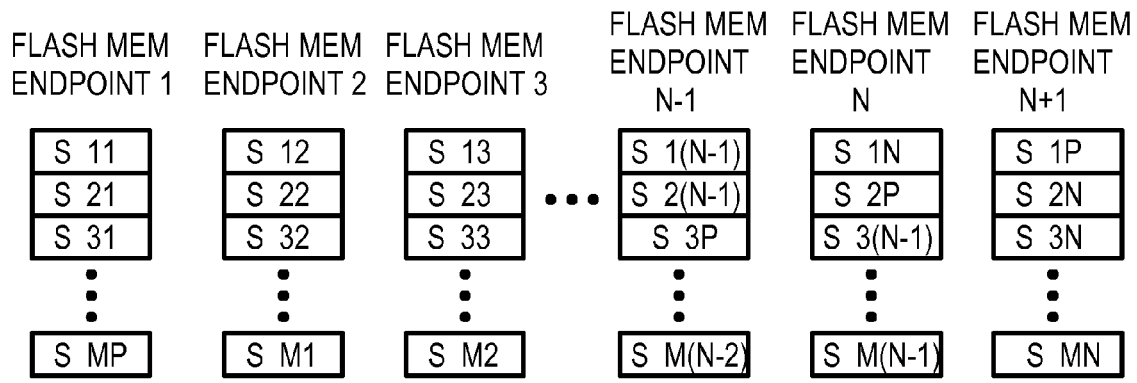

FIG. 4D shows a distributed one-dimensional parity arrangement that loads parity in a diagonal arrangement. S1P, S2P, S3P form a diagonal across endpoints N−1, N, N+1. Fig. The parity is distributed across the diagonal direction to even out loading and to avoid heavy read and write traffic that might occur in a particular P channel in the approach of FIG. 4C.

Figure 4E:
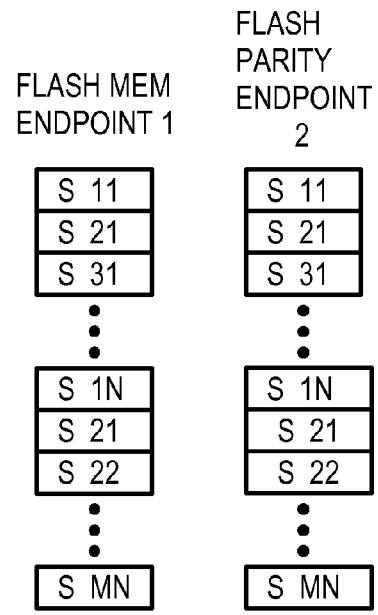

FIG. 4E shows a one-dimensional parity that uses only two endpoints. The contents of the two endpoints are identical. Thus data is stored redundantly. This is a very easy approach but may waste storage space.

Figure 4F:
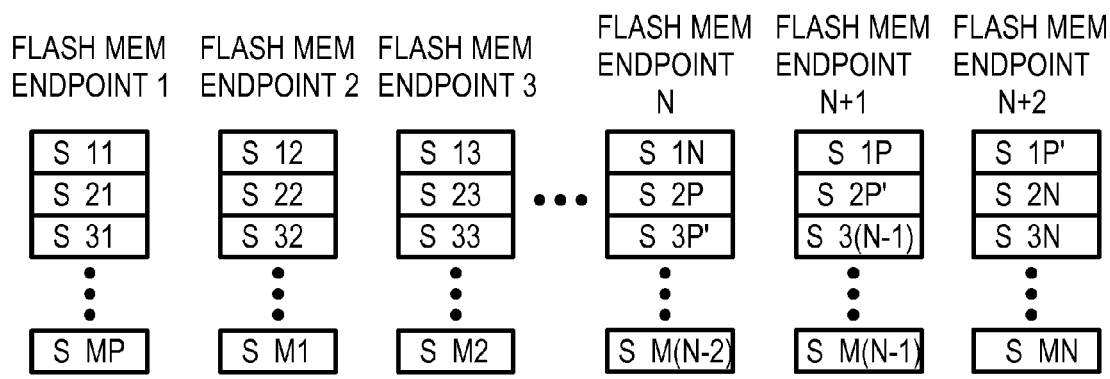

FIGS. 4E and 4F are the similar to FIGS. 4C and 4D with distributed parity on all endpoints instead of concentrated on one or two endpoints to avoid heavy usage on the parity segments.

FIG. 4F shows another alternate data striping arrangement using two orthogonal dimension error correction values, parity and ECC. Two orthogonal dimension ECC or parity has two different methods of error detection/correction. For example, segment S1P uses one parity or ECC method, while segment SIP' uses the second ECC method. A simple example is having one dimension using a hamming code, while the second dimension is a Reed-Solomon method or a BCH method. With more dimension codes, the possibility of recovery is much higher, protecting data consistency in case any single-chip flash-memory device fails in the middle of an operation. A flash-memory device that is close to failure may be replaced before failing to prevent a system malfunction.

Errors may be detected through two-level error checking and correction. Each storage segment, including the parity segment, has a page-based ECC. When a segment page is read, bad bits can be detected and corrected according to the strength of the ECC code, such as a Reed-Solomon code. In addition, the flash storage segments form a stripe with parity on one of the segments.

As shown in FIGS. 4C-F, data can be stored in the flash storage endpoints' segments with extra parity or ECC segments in several arrangements and in a linear fashion across the flash storage segments. Also, data can be arranged to provide redundant storage, which is similar to a redundant array of independent disks (RAID) system in order to improve system reliability. Data is written to both segments and can be read back from either segment.

Figure 5:
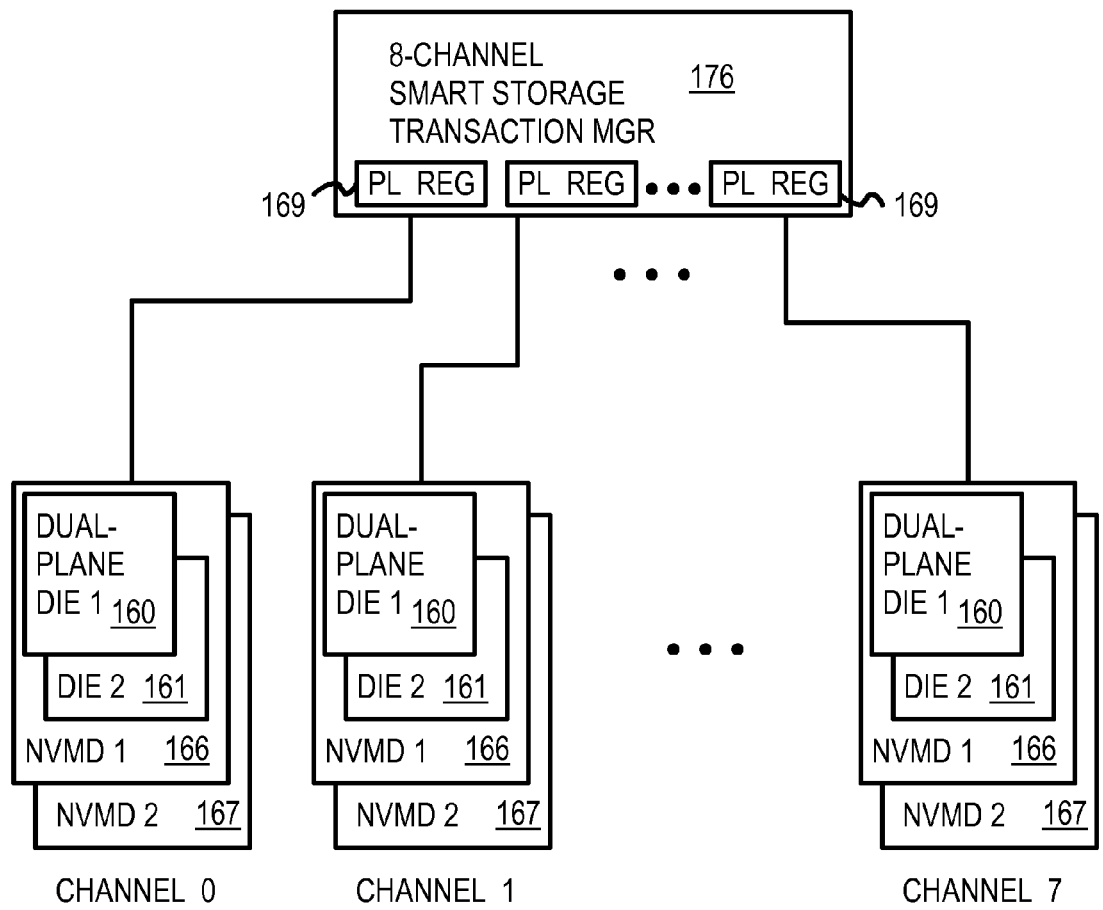
FIG. 5 shows multiple channels of dual-die and dual-plane flash-memory devices.

FIG. 5 shows multiple channels of dual-die and dual-plane flash-memory devices. Multi-channel NVM controller 176 can drive 8 channels of flash memory, and can be part of smart storage switch 30 (FIG. 1A). Each channel has a pair of flash-memory multi-die packaged devices 166, 167, each with first die 160 and second die 161, and each die with two planes per die. Thus each channel can write eight planes or pages at a time. Data is striped into stripes of 8 pages each to match the number of pages that may be written per channel. Pipeline registers 169 in multi-channel NVM controller 176 can buffer data to each channel.

Figure 6:
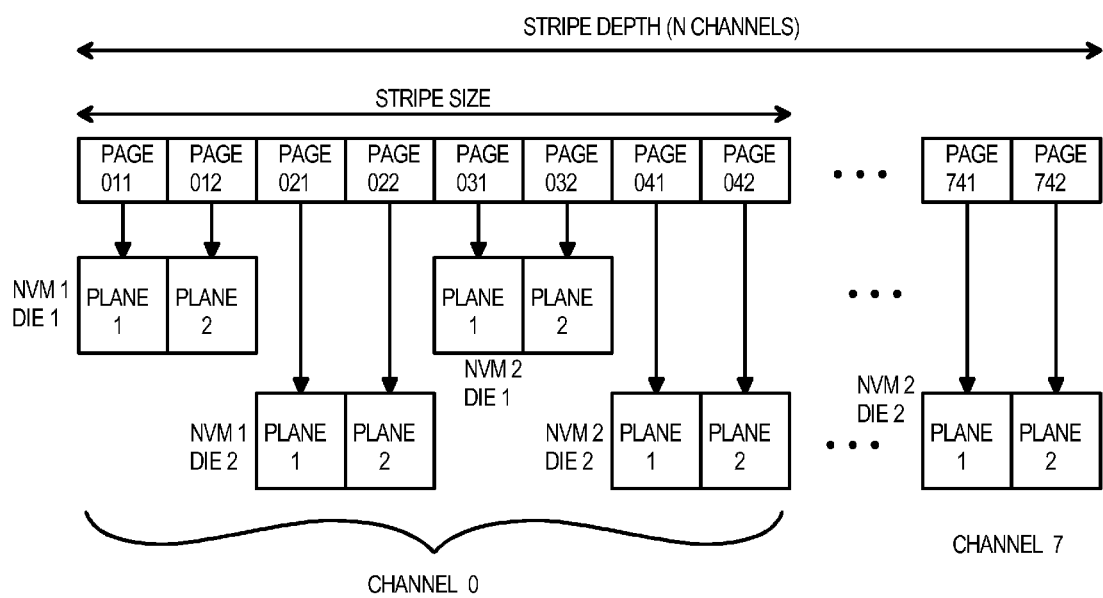
FIG. 6 highlights data striping that has a stripe size that is closely coupled to the flash-memory devices.

FIG. 6 highlights data striping that has a stripe size that is closely coupled to the flash-memory devices. Flash modules 73 of FIG. 2 and other figures may have two flash-chip packages per channel, tow flash-memory die per package, and each flash memory die has two planes. Having two die per package, and two planes per die increases flash access speed by utilizing two-plane commands of flash memory. The stripe size may be set to eight pages when each plane can store one page of data. Thus one stripe is written to each channel, and each channel has one flash module 73 with two die that act as raw-NAND flash memory chips 68.

The stripe depth is the number of channels times the stripe size, or N times 8 pages in this example. An 8-channel system with four die per channel and two planes per die has 8 times 8 or 64 pages of data as the stripe depth that is set by smart storage switch 30. Data striping methods may change according to the physical flash memory architecture, when either the number of die or planes is increased, or the page size varies. Striping size may change with the flash memory page size to achieve maximum efficiency. The purpose of page-alignment is to avoid mis-match of local and central page size to increase access speed and improve wear leveling.

When a flash transaction layer function is performed, NVM controller 76 receives a Logical Sector Address (LSA) from smart storage switch 30 and translates the LSA to a physical address in the multi-plane flash memory.

Figure 7:
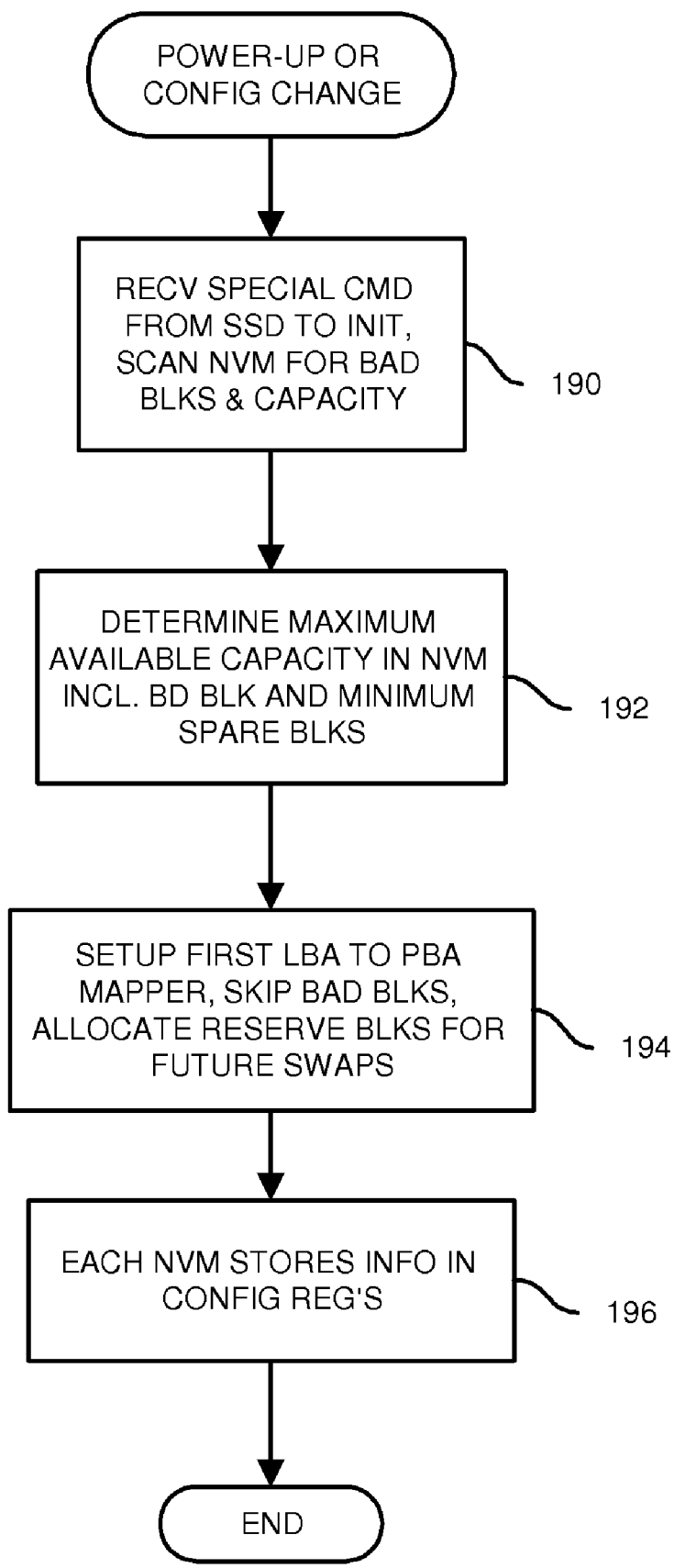
FIG. 7 is a flowchart of an initialization or power-up for each NVM controller 76 using data striping.

FIG. 7 is a flowchart of an initialization for each NVM controller 76 using data striping. When the NVM controller 76 controls multiple die of raw-NAND flash memory chips 68 with multiple planes per die for each channel, such as shown in FIGS. 5-6, each NVM controller 76 performs this initialization routine when power is applied during manufacturing or when the configuration is changed.

Each NVM controller 76 receives a special command from the smart storage switch, step 190, which causes NVM controller 76 to scan for bad blocks and determine the physical capacity of flash memory controlled by the NVM controller.

The maximum available capacity of all flash memory blocks in all die controlled by the NVM controller is determined, step 192, and the minimum size of spare blocks and other system resources. The maximum capacity is reduced by any bad blocks found. These values are reserved for use by the manufacturing special command, and are programmable values, but they cannot be changed by users.

Mapping from LBA's to PBA's is set up in a mapper or mapping table, step 194, for this NVM controller 76. Bad blocks are skipped over, and some empty blocks are reserved for later use to swap with bad blocks discovered in the future. The configuration information is stored in configuration registers in NVM controller 76, step 196, and is available for reading by the smart storage switch.

Figure 8:
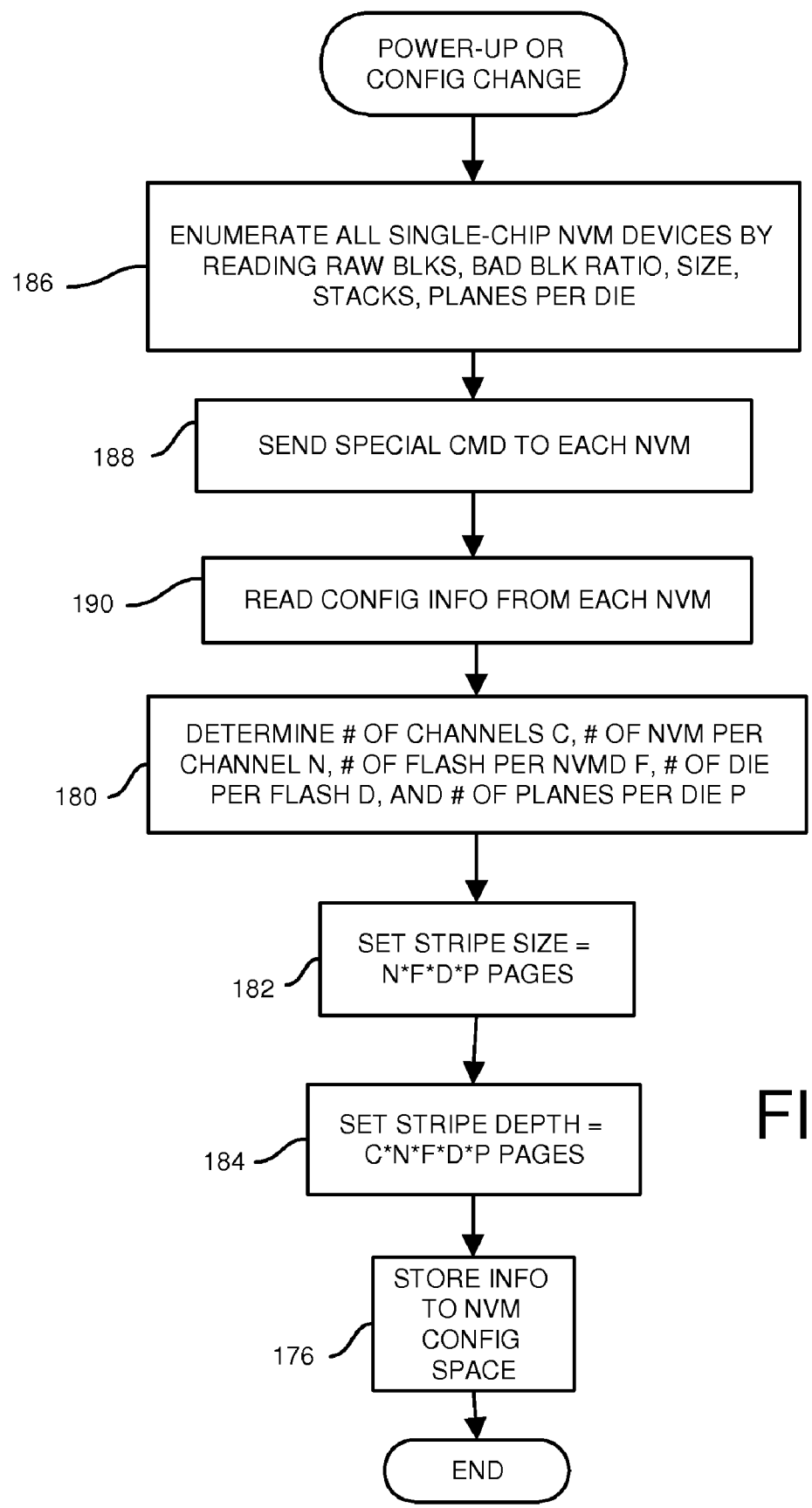
FIG. 8 is a flowchart of an initialization or power-up of the smart storage switch when using data striping.

FIG. 8 is a flowchart of an initialization of the smart storage switch when using data striping. When each NVM controller 76 controls multiple die of raw-NAND flash memory chips 68 with multiple planes per die for each channel, such as shown in FIGS. 5-6, the smart storage switch performs this initialization routine when power is applied during system manufacturing or when the configuration is changed.

The smart storage switch enumerates all NVM controllers 76, step 186, by reading the raw flash blocks in raw-NAND flash memory chips 68. The bad block ratio, size, stacking of die per device, and number of planes per die are obtained. The smart storage switch sends the special command to each NVM controller 76, step 188, and reads configuration registers on each NVM controller 76, step 190.

For each NVM controller 76 enumerated in step 186, the number of planes P per die, the number of die D per flash chip, the number of flash chips F per NVM controller 76 are obtained, step 180. The number of channels C is also obtained, which may equal the number of NVM controllers 76 or be a multiple of the number of NVM controllers 76.

The stripe size is set to N*F*D*P pages, step 182. The stripe depth is set to C*N*F*D*P pages, step 184. This information is stored in the NVM configuration space, step 176.

Figure 9:
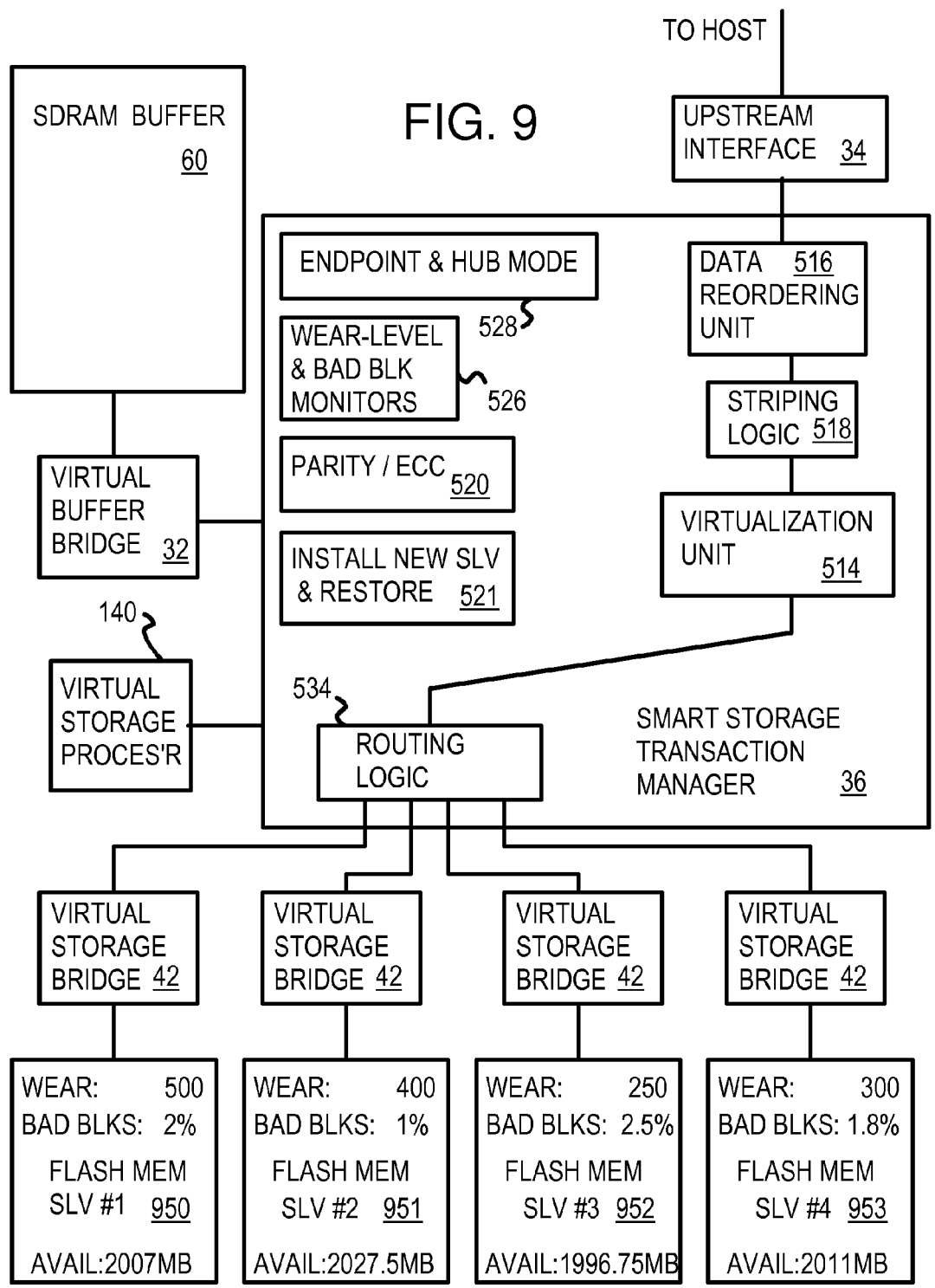
FIG. 9 shows a quad-channel smart storage switch with more details of the smart storage transaction manager.

FIG. 9 shows a quad-channel smart storage switch with more details of the smart storage transaction manager. Virtual storage processor 140, virtual buffer bridge 32 to SDRAM buffer 60, and upstream interface 34 to the host all connect to smart storage transaction manager 36 and operate as described earlier.

Four channels to four flash modules 950-953, each begin a flash module 73 shown in FIGS. 2-3, are provided by four of virtual storage bridges 42 that connect to multi-channel interleave routing logic 534 in smart storage transaction manager 36. Host data can be interleaved among the four channels and four flash modules 950-953 by routing logic 534 to improve performance.

Host data from upstream interface 34 is re-ordered by reordering unit 516 in smart storage transaction manager 36. For example, host packets may be processed in different orders than received. This is a very high-level of re-ordering.

Striping logic 518 can divide the host data into stripes that are written to different physical devices, such as for a Redundant Array of Inexpensive Disks (RAID). Parity and ECC data can be added and checked by ECC logic 520, while SLV installer 521 can install a new storage logical volume (SLV) or restore an old SLV. The SLV logical volumes can be assigned to different physical flash devices, such as shown in this Fig. for flash modules 950-953, which are assigned SLV#1, #2, #3, #4, respectively.

Virtualization unit 514 virtualizes the host logical addresses and concatenates the flash memory in flash modules 950-953 together as one single unit for efficient data handling such as by remapping and error handling. Remapping can be performed at a high level by smart storage transaction manager 36 using wear-level and bad-block monitors 526, which monitor wear and bad block levels in each of flash modules 950-953. This high-level or presidential wear leveling can direct new blocks to the least-worn of flash modules 950-953, such as flash module 952, which has a wear of 250, which is lower than wears of 500, 400, and 300 on other flash module. Then flash module 952 can perform additional low-level or governor-level wear-leveling among raw-NAND flash memory chips 68 (FIG. 2) within flash module 952.

Thus the high-level "presidential" wear-leveling determines the least-worn volume or flash module, while the selected device performs lower-level or "governor" wear-leveling among flash memory blocks within the selected flash module. Using such presidential-governor wear-leveling, overall wear can be improved and optimized.

Endpoint and hub mode logic 528 causes smart storage transaction manager 36 to perform aggregation of endpoints for switch mode. Rather than use wear indicators, the percent of bad blocks can be used by smart storage transaction manager 36 to decide which of flash modules 950-953 to assign a new block to. Channels or flash modules with a large percent of bad blocks can be skipped over. Small amounts of host data that do not need to be interleaved can use the less-worn flash module, while larger amounts of host data can be interleaved among all four flash modules, including the more worn modules. Wear is still reduced, while interleaving is still used to improve performance for larger multi-block data transfers.

Figure 10:
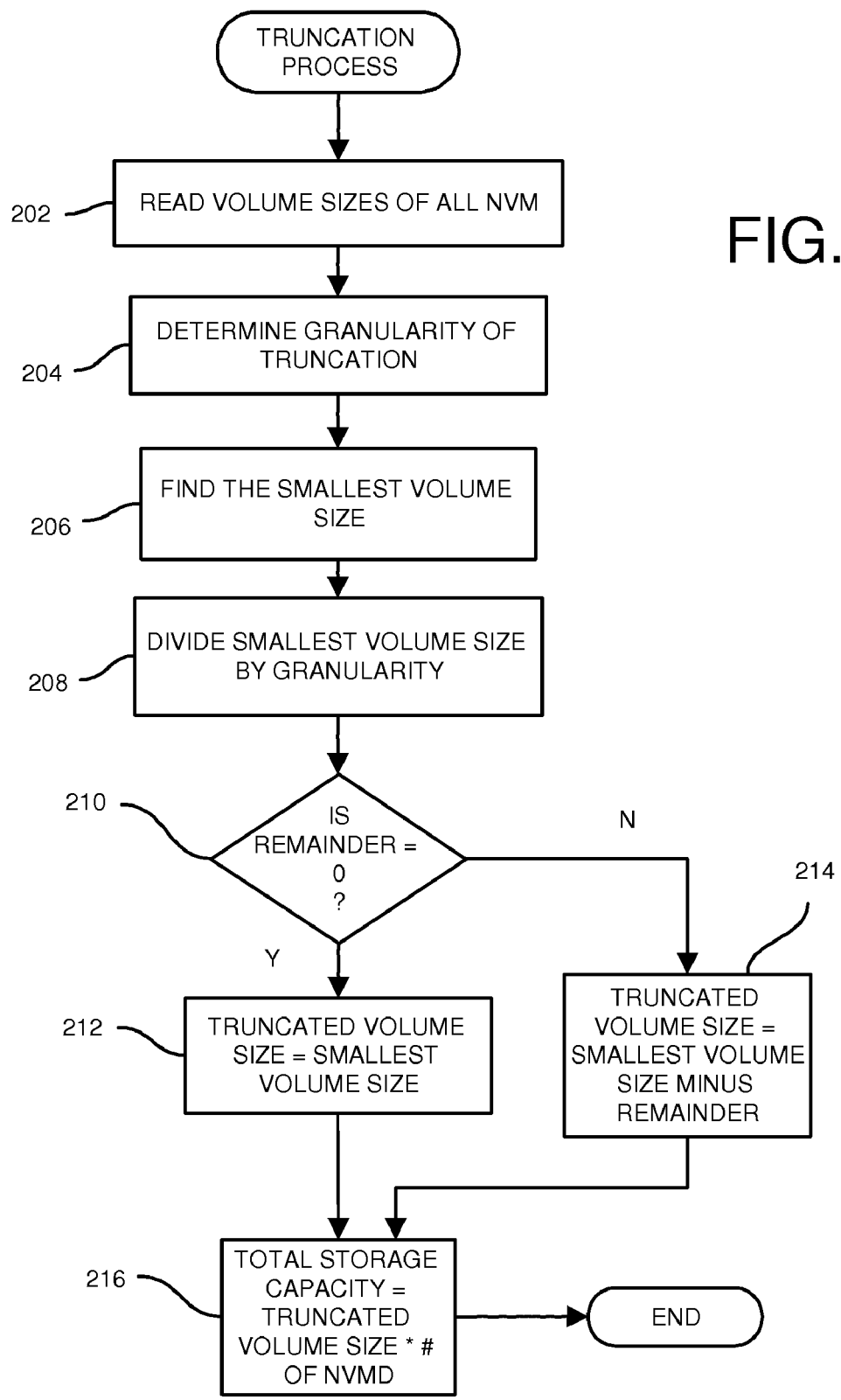
FIG. 10 is a flowchart of a truncation process.

FIG. 10 is a flowchart of a truncation process. The sizes or capacity of flash memory in each channel may not be equal. Even if same-size flash devices are installed in each channel, over time flash blocks wear our and become bad, reducing the available capacity in a channel.

FIG. 9 showed four channels that had capacities of 2007, 2027.5, 1996.75, and 2011 MB in flash modules 950-953. The truncation process of FIG. 10 finds the smallest capacity, and truncates all other channels to this smallest capacity. After truncation, all channels have the same capacity, which facilitates data striping, such as shown in FIG. 4.

The sizes or capacities of all volumes of flash modules are read, step 202. The granularity of truncation is determined, step 204. This granularity may be a rounded number, such as 0.1 MB, and may be set by the system or may vary.

The smallest volume size is found, step 206, from among the sizes read in step 202. This smallest volume size is divided by the granularity, step 208. When the remainder is zero, step 210, the truncated volume size is set to be equal to the smallest volume size, step 212. No rounding was needed since the smallest volume size was an exact multiple of the granularity.

When the remainder is not zero, step 210, the truncated volume size is set to be equal to the smallest volume size minus the remainder, step 214. Rounding was needed since the smallest volume size was not an exact multiple of the granularity.

The total storage capacity is then set to be the truncated volume size multiplied by the number of volumes of flash memory, step 216.

Figure 11:
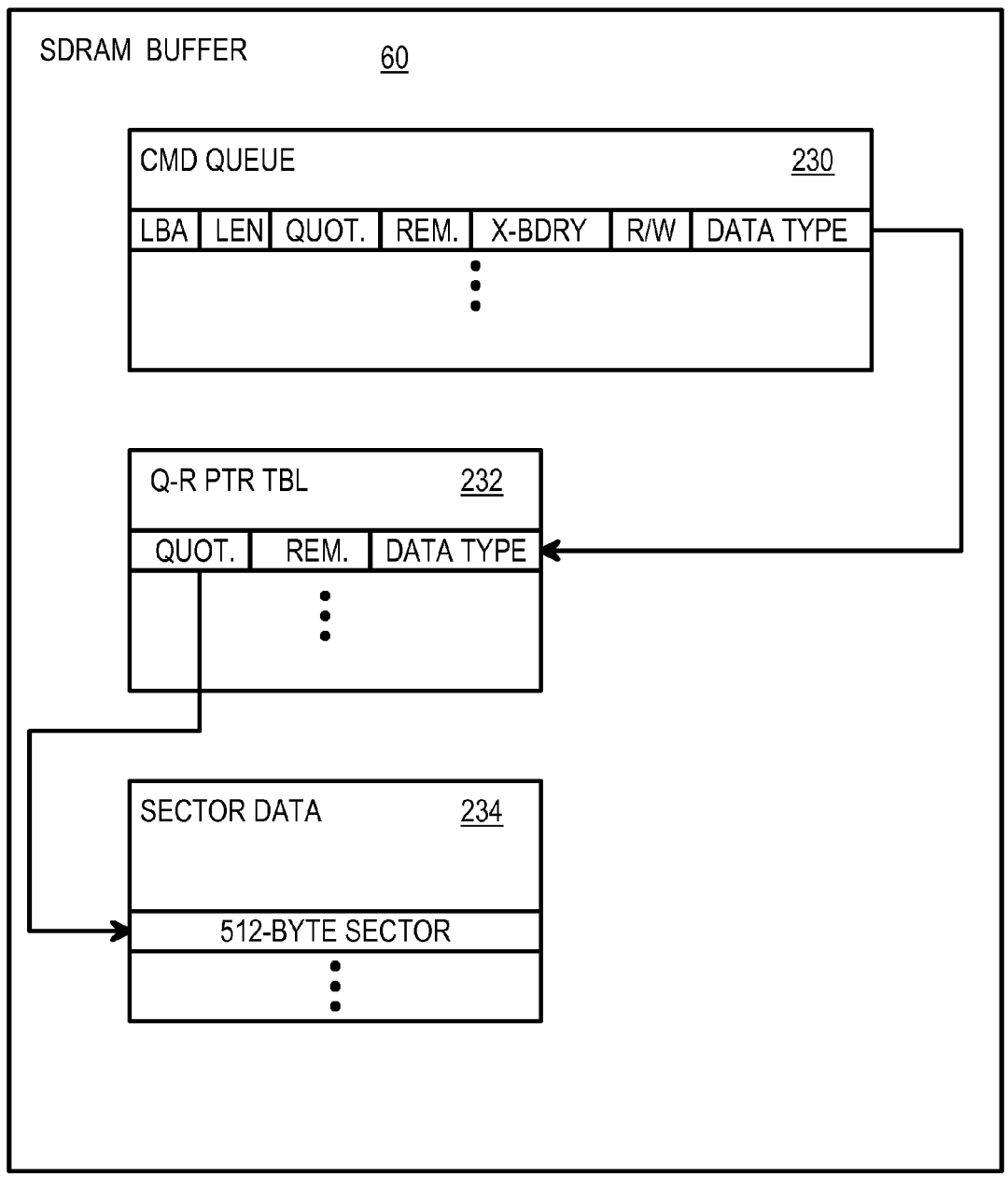
FIG. 11 shows a command queue and a Q-R Pointer table in the SDRAM buffer.

FIG. 11 shows a command queue and a Q-R Pointer table in the SDRAM buffer. SDRAM 60 stores sector data from the host that is to be written into the flash modules as sector data buffer 234. Reads to the host may be supplied from sector data buffer 234 rather than from slower flash memory when a read hits into sector data buffer 234 in SDRAM 60.

Q-R pointer table 232 contains entries that point to sectors in sector data buffer 234. The logical address from the host is divided by the size of sector data buffer 234, such as the number of sectors that can be stored. This division produces a quotient Q and a remainder R. The remainder selects one location in sector data buffer 234 while the quotient can be used to verify a hit or a miss in sector data buffer 234. Q-R pointer table 232 stores Q, R, and a data type DT. The data type indicates the status of the data in SDRAM 60. A data type of 01 indicates that the data in SDRAM 60 needs to be immediately flushed to flash memory. A data type of 10 indicates that the data is valid only in SDRAM 60 but has not yet been copied to flash memory. A data type of 11 indicates that the data is valid in SDRAM 60 and has been copied to flash, so the flash is also valid. A data type of 00 indicates that the data is not valid in SDRAM 60.

Data Types:

0, 0—Location is empty 1, 0—Data needs to be flushed into flash memory for storage, however the process can be in the background, no immediate urgency.

0, 1—Data is in the process of writing into flash memory, needs to be done immediately.

1, 1—Data has already written into flash memory. The remaining image in SDRAM can be used for immediate Read or can be written by new incoming data.

Commands from the host are stored in command queue 230. An entry in command queue 230 for a command stores the host logical address LBA, the length of the transfer, such as the number of sectors to transfer, the quotient Q and remainder R, a flag X-BDRY to indicate that the transfer crosses the boundary or end of sector data buffer 234 and wraps around to the beginning of sector data buffer 234, a read-write flag, and the data type. Other data could be stored, such as an offset to the first sector in the LBA to be accessed. Starting and ending logical addresses could be stored rather than the length.

Figure 12:
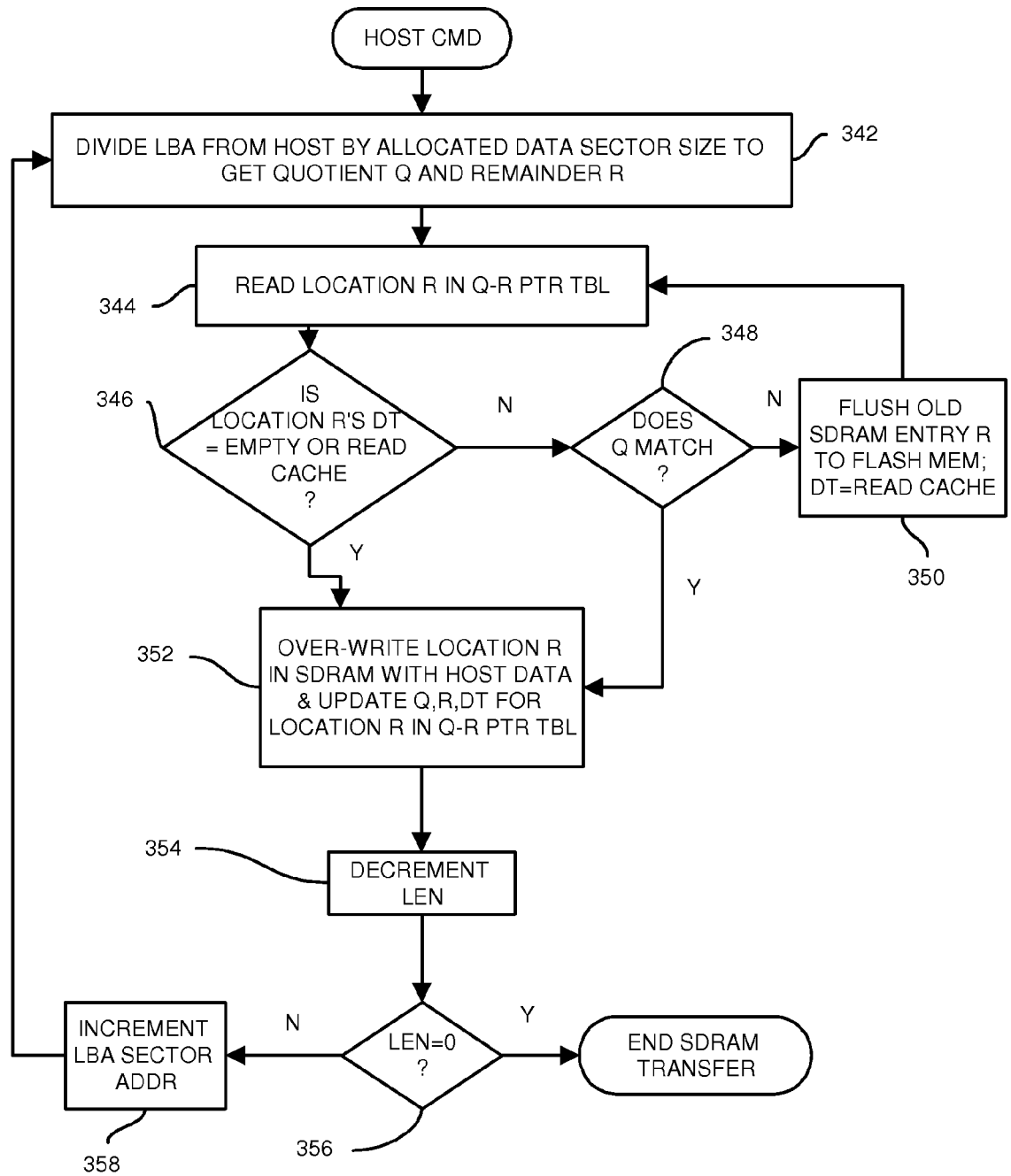
FIG. 12 is a flowchart of a host interface to the sector data buffer in the SDRAM.

FIG. 12 is a flowchart of a host interface to the sector data buffer in the SDRAM. When a command from the host is received by the smart storage switch, the host command includes a logical address such as a LBA. The LBA is divided by the total size of sector data buffer 234 to get a quotient Q and a remainder R, step 342. The remainder R points to one location in sector data buffer 234, and this location is read, step 344. When the data type of the location R is either empty (00) or read cache (11), the location R may be overwritten since empty data type 00 can be overwritten with new data which does not have to be copied back to flash immediately and the read cache sector data has already been flushed back to flash memory, so that new data can be overwritten. The new data from the host overwrites location R in sector data buffer 234, and this location's entry in Q-R pointer table 232 is updated with the new Q, step 352. The data type is set to 10 to indicate that the data must be copied to flash, but not right away.

The length LEN is decremented, step 354, and the host transfer ends when LEN reaches 0, step 356. Otherwise, the LBA sector address is incremented, step 358, and processed going back to step 342.

When location R read in step 344 has a data type of 01 or 10, step 346, the data in location R in SDRAM 60 is dirty and cannot be overwritten before flushing to flash unless the host is overwriting to the exact same address. When the quotient Q from the host address matches the stored Q, a write hit occurs, step 348. The new data from the host can overwrite the old data in sector data buffer 234, step 352. The data type is set to 10.

When the quotient Q does not match, step 348, then the host is writing to a different address. The old data in sector data buffer 234 must be flushed to flash immediately. The data type is first set to 01. Then the old data is written to flash, or to a write buffer such as a FIFO to flash, step 350. Once the old data has been copied for storage in flash, the data type can be set to read cache, 11. Then the process can loop back to step 344, and step 346 will be true, leading to step 352 where the host data will overwrite the old data that was copied to flash.

Figure 13A:
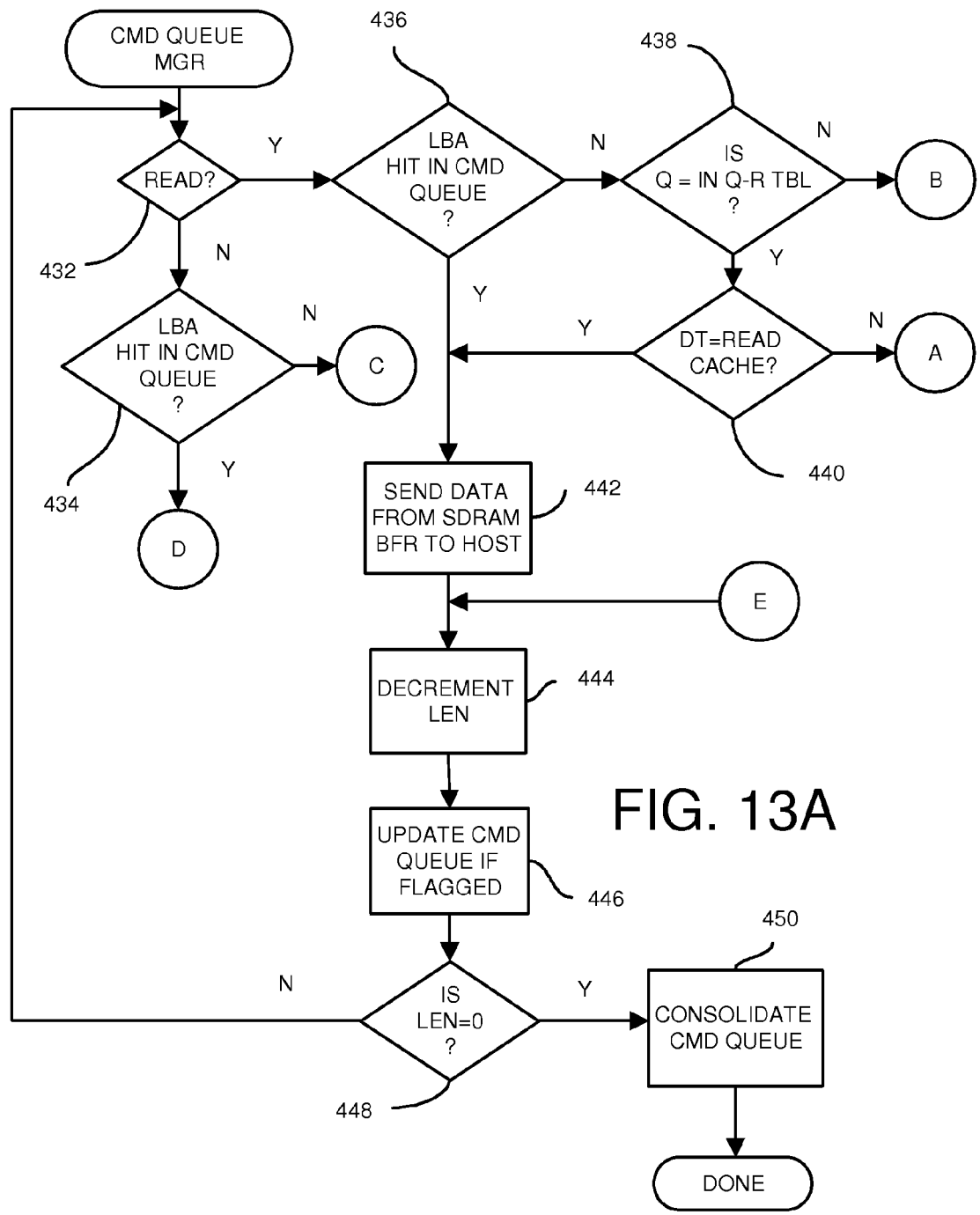
FIG. 13A-C is a flowchart of operation of a command queue manager.
Figure 13B:
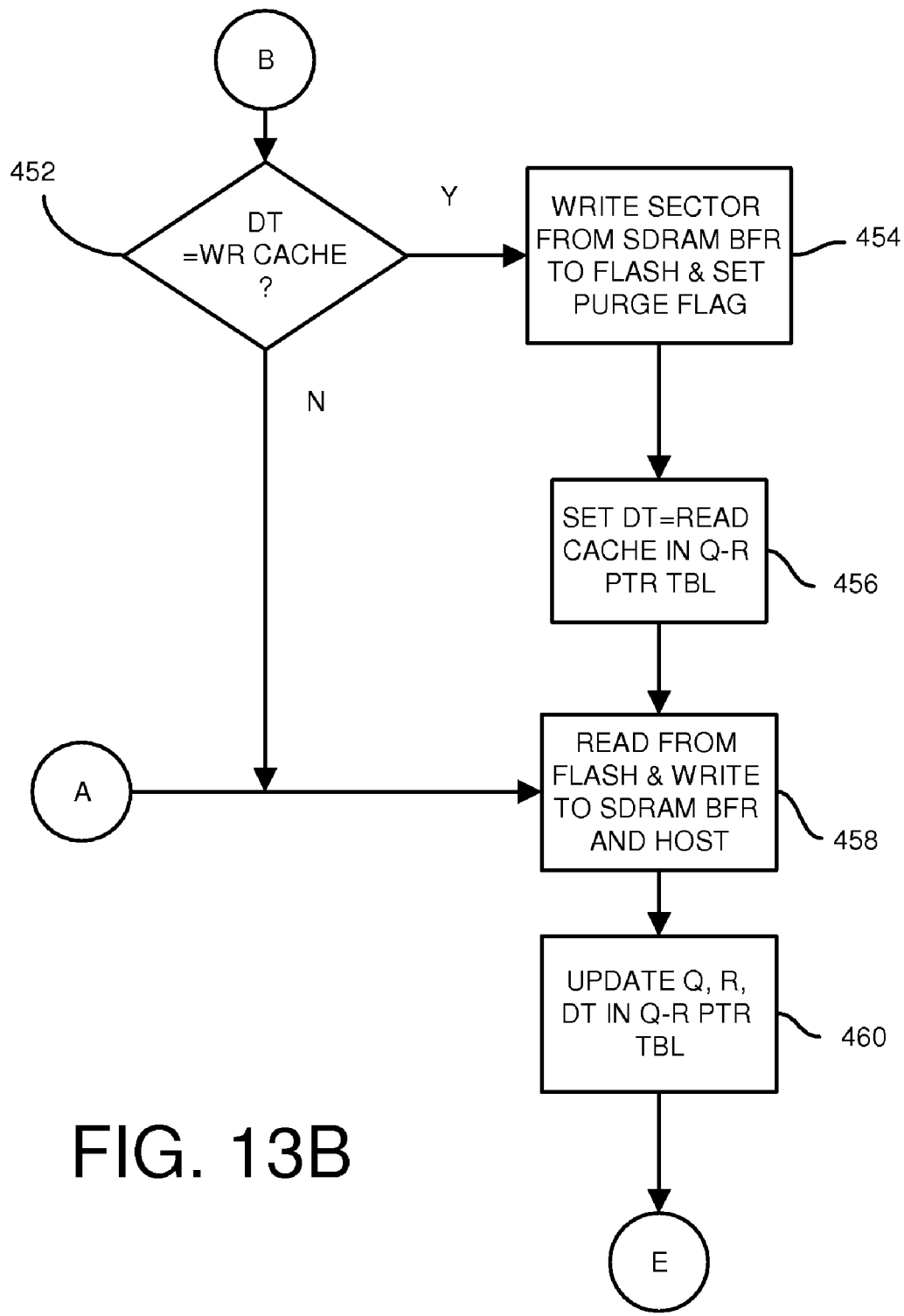
Figure 13C:
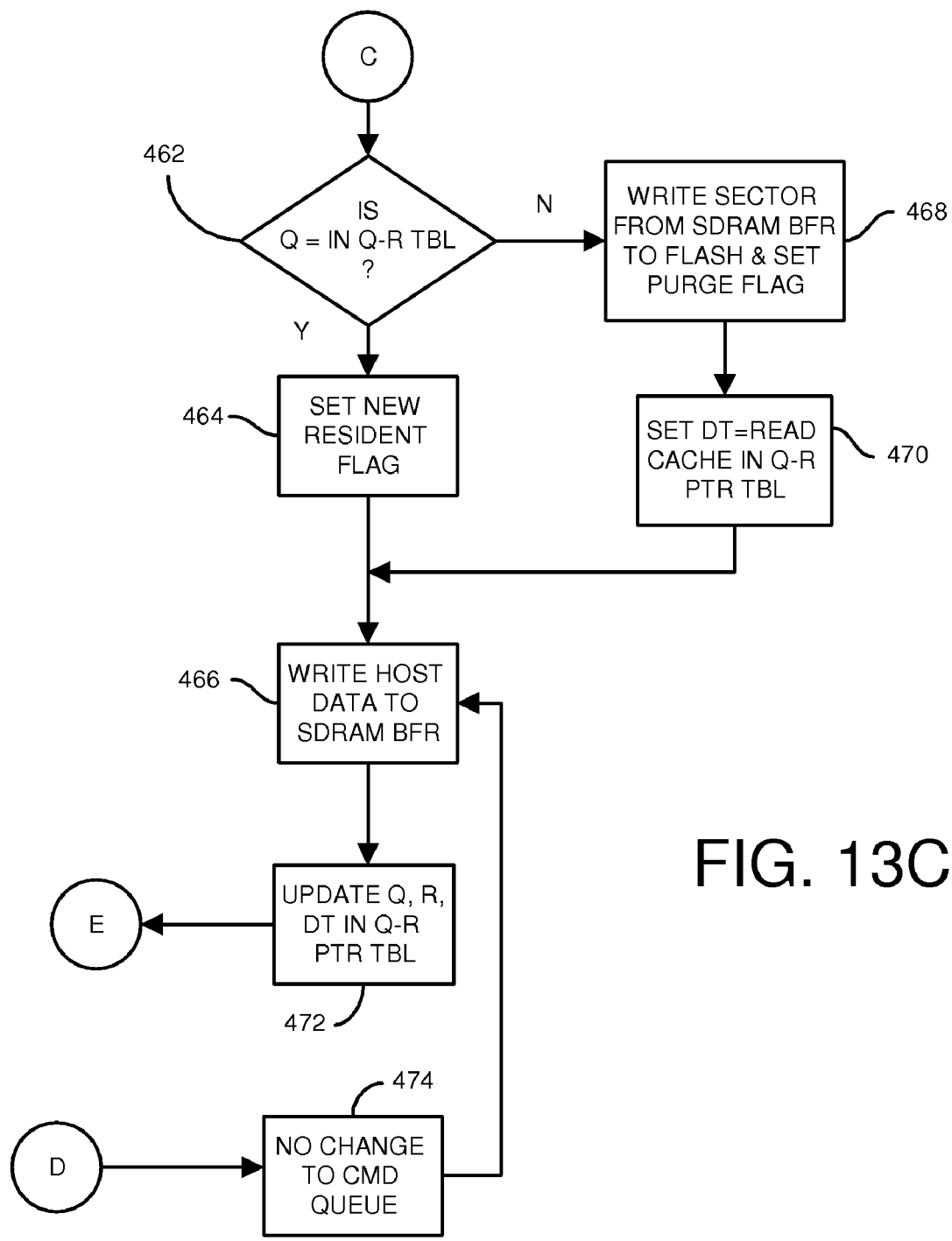

FIG. 13A-C is a flowchart of operation of a command queue manager. The command queue manager controls command queue 230 of FIG. 11. When the host command is a read, step 432, and the LBA from the host hits in the command queue when the LBA falls within the range of LEN from the starting LBA, step 436, the data from the host is read from the sector data buffer, step 442, and sent to the host. A flash read has been avoided by caching. The length can be decremented, step 444, and the command queue updated if needed, step 446. When the length reaches zero, step 448, the order of entries in the command queue can be re-prioritized, step 450, before the operation ends. When the length is non-zero, the process repeats from step 432 for the next data in the host transfer.

When the host LBA read misses in the command queue, step 436, and the quotients Q match in Q-R pointer table 232, step 438, there is a matching entry in sector data buffer 234 although there is no entry in command queue 230. When the data type is read cache, step 440, the data may be read from sector data buffer 234 and sent to the host, step 442. The process continues as described before.

When the data type is not read cache, step 440, the process continues with A on FIG. 13B. The flash memory is read and loaded into SDRAM and sent to the host, step 458. Q, R, and the data type are updated in Q-R pointer table 232, step 460, and the process continues with step 444 on FIG. 13A.

When the quotients Q do not match in Q-R pointer table 232, step 438, there is no matching entry in sector data buffer 234 and the process continues with B on FIG. 13B. In FIG. 13B, when the data type is write cache, (10 or 01), step 452, the old data is cast out of sector data buffer 234 and written to flash for necessary back up, step 454. The purge flag is then set, after the data is flushed to flash memory. Once the old data has been copied to a buffer for writing into flash, the data type can be set to read cache 11 in Q-R pointer table 232, step 456. The flash memory is read on request and loaded into SDRAM to replaced the old data and sent to the host, step 458. Q, R, and the data type 11 are updated in Q-R pointer table 232, step 460, and the process continues with E to step 444 on FIG. 13A.

When the data type is not write cache as recorded in the SDRAM, (00 or 11), step 452, the flash memory is read and loaded into SDRAM and sent to the host, step 458. Q, R, and the data type 11 are updated in Q-R pointer table 232, step 460, and the process continues with step 444 on FIG. 13A.

In FIG. 13A, when the host command is a write, step 432, and the LBA from the host hits in the command queue, step 434, the process continues with D on FIG. 13C. The command queue is not changed, step 474. The write data form the host is written into sector data buffer 234, step 466. Q, R, and the data type are updated in Q-R pointer table 232, step 472, and the process continues with step 444 on FIG. 13A.

In FIG. 13A, when the host command is a write, step 432, and the LBA from the host does not hit in the command queue, step 434, the process continues with C on FIG. 13C. When the quotients Q match in Q-R pointer table 232, step 462, there is a matching entry in sector data buffer 234. The new resident flag is set, step 464, indicating that the entry does not overlap with another entry in the command queue. The write data form the host is written into sector data buffer 234, step 466. Q, R, and the data type 01 (write cache) are updated in Q-R pointer table 232, step 472, and the process continues with E, step 444 on FIG. 13A.

When the quotient Q dos not match in Q-R pointer table 232, step 462, there is no matching entry in sector data buffer 234. The old data is cast out of sector data buffer 234 and written to flash, step 468. The purge flag is set, such as by setting the data type to 11. The purge flag indicates that the data has been sent to the flash and can be safely overwritten. Once the old data has been copied to a buffer for writing into flash, the data type can be set to read cache 11 in Q-R pointer table 232, step 470. The write data from the host is written into sector data buffer 234, step 466. Q, R, and the data type are updated in Q-R pointer table 232, step 472, and the process continues with step 444 on FIG. 13A.

In FIG. 13A, when the host command is a write, step 432, and the LBA from the host hits in the command queue, step 434, the process continues with D on FIG. 13C. It will do nothing to the command queue at step 474, then continues to write data from the host into sector data buffer 234, step 466. Q, R, and the data type 10 are updated in Q-R pointer table 232, step 472, and the process continues with E to step 444 on FIG. 13A.

Figure 14:
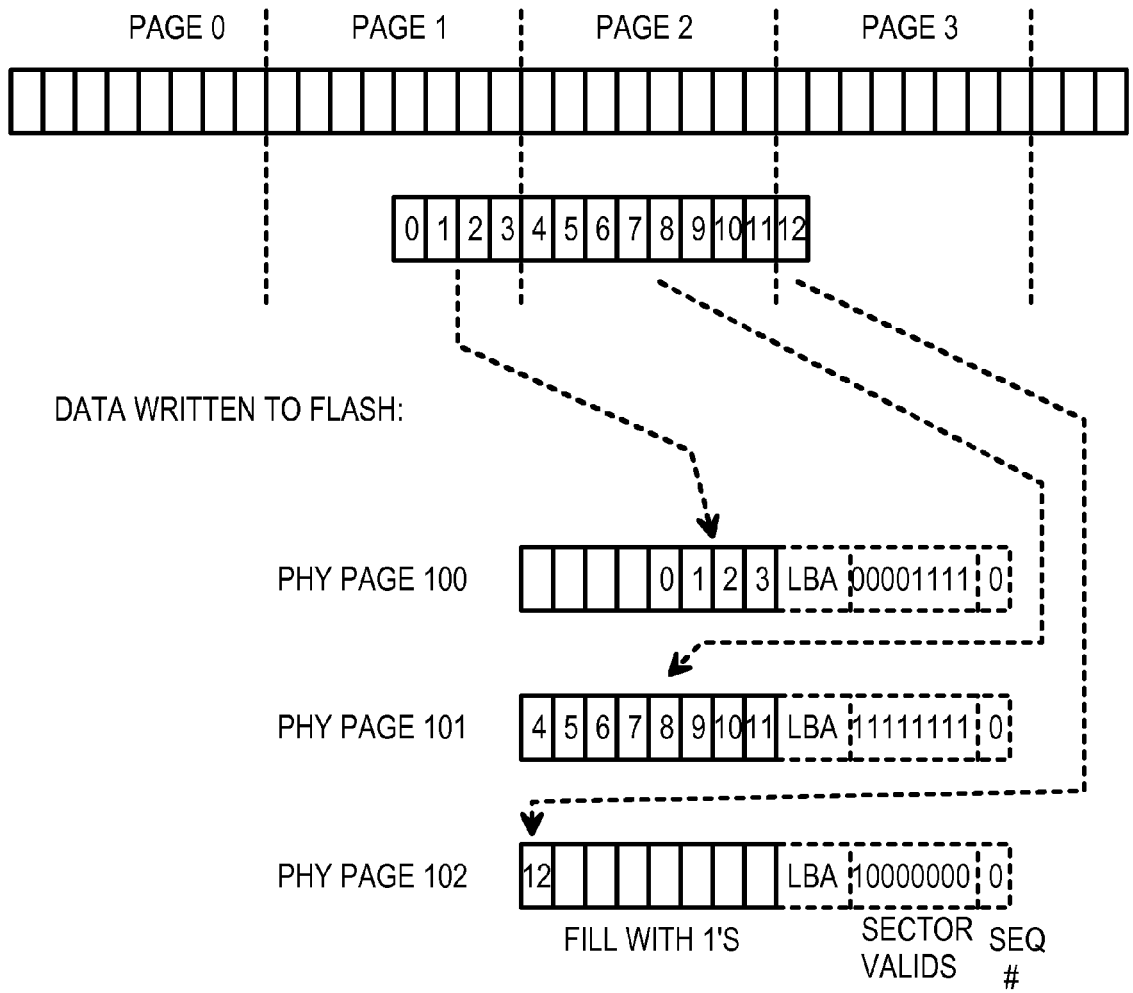
FIG. 14 highlights page alignment in the SDRAM and in flash memory.

FIG. 14 highlights page alignment in the SDRAM and in flash memory. Pages may each have several sectors of data, such as 8 sectors per page in this example. A host transfer has 13 sectors that are not page aligned. The first four sectors 0, 1, 2, 3 are stored in page 1 of the sector data buffer 234 in SDRAM 60, while the next 8 sectors fill page 2, and the final sector is in page 3.

When the data in sector data buffer 234 is flushed to flash memory, the data from this transfer is stored in 3 physical pages in flash memory. The 3 pages do not have to be sequential, but may be on different raw-NAND flash memory chips 68. The LBA, a sequence number, and sector valid bits are also stored for each physical page in flash memory. The sector valid bits are all set for physical page 101, since all 8 sectors are valid. The first four sectors in physical page 100 are set to all 1's while the valid data is stored in the last four sectors of this page. These were sectors 0, 1, 2, 3 of the host transfer. Physical page 102 receives the last sector from the host transfer and stores this sector in the first sector location in the physical page. The valid bits of the other 7 sectors have their data bits all set to 0's, and the data sectors of these 7 sectors are unchanged.

FIG. 15 highlights a non-aligned data merge. Physical pages 100, 101, 102 have been written as described in FIG. 14. New host data is written to pages 1 and 2 of the SDRAM buffer and match the Q and R for the old data stored in physical page 101.

Sectors in page 1 with data A, B, C, D, E are written to new physical page 103. The sequence number is incremented to 1 for this new transfer.

Old physical page 101 is invalidated, while its sector data 6, 7, 8, 9, 10, 11 are copied to new physical page 200. Host data F,G from SDRAM 60 is written to the first two sectors in this page 200 to merge the data. Old data 4, 5 is over-written by the new data F, G. SEQ# is used to distinguish which version is newer, in this case physical page 101 and 200 have the same LBA number as recorded in FIG. 15. Firmware will check its associated SEQ# to determine which page is valid.

FIG. 16A-K are examples of using a command queue with a SDRAM buffer in a flash-memory system. SDRAM 60 has sector data buffer 234 with 16 locations for sector data for easier illustration. In this example each location holds one sector, but other page-based examples could store multiple sectors per page location. The locations in SDRAM 60 are labeled 0 to 15. Since there are 16 locations in SDRAM 60, the LBA is divided by 16, and the remainder R selects one of the 16 locations in SDRAM 60.

In FIG. 16A, after initialization command queue 230 is empty. No host sector data is stored in SDRAM 60. In FIG. 16B, the host writes C0 to LBA=1, with a length LEN of 3. An entry is loaded in command queue 230 for write C0, with LBA set to 1 and LEN set to 3. Since the LBA divided by 16 has a quotient Q of 0 and a remainder R of 3, 0,3 are stored for Q,R. The data type is set to 10, dirty and not yet flushed to flash. Data C0 is written to locations 1, 2, 3 in SDRAM 60. The three sectors 1, 2, 3 of Q-R PTR TBL 232 which point to the corresponding sector data 234 will have 0,1,10 for the first sector, 0,2,10 for the second, and 0,3,10 for the last sector in its contents. Note that the data value of write C0 may have any value and differ for each sector in sector data 234. C0 simply identifies the write command for this example.

In FIG. 16C, the host writes C1 to LBA=5, with a length LEN of 1. Another entry is loaded in command queue 230 for write C1, with LBA set to 5 and LEN set to 1. Since the LBA divided by 16 has a quotient Q of 0 and a remainder R of 5, 0,5 are stored for Q,R. The data type is set to 10, dirty and not yet flushed to flash. Data C1 is written to location 5 in sector data 234 in SDRAM 60. Sector 5 of Q-R pointer table 232 is filled with 0,5,10.

Figure 16D:
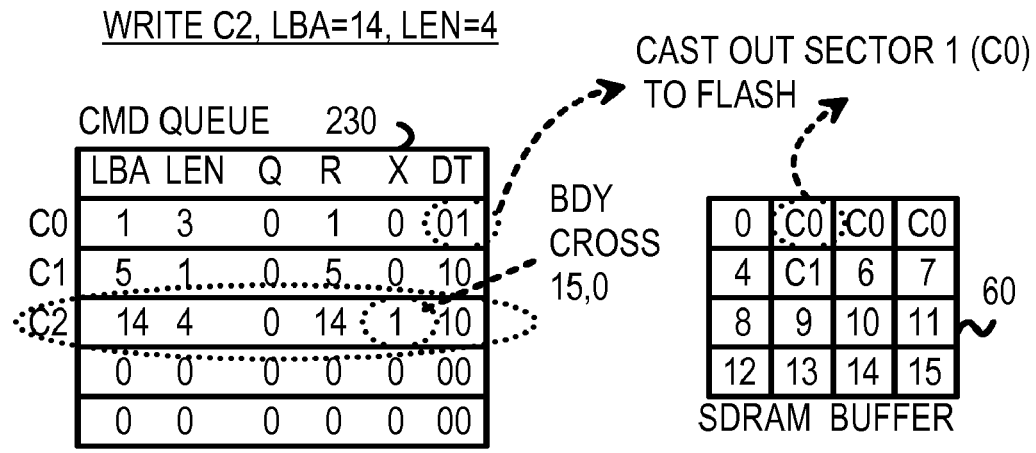

In FIG. 16D, the host writes C2 to LBA=14, with a length LEN of 4. A third entry is loaded in command queue 230 for write C2, with LBA set to 14 and LEN set to 4. Since the LBA divided by 16 has a quotient Q of 0 and a remainder R of 14, 0,14 are stored for Q,R. The data type is set to 10, dirty and not yet flushed to flash.

Since the length of 4 writes to sectors 14, 15, 0, 1, which crosses or wraps from sector 15 to sector 0, the cross-boundary flag X is set for this entry. Since sector 1 was previously written by write C0, and C0 has not yet been written to flash, the old C0 data in sector 1 must be immediately flushed or cast out to flash. The data type for the first entry is changed to 01, which indicates that an immediate write to flash is needed. This data type has a higher priority than other data types so that the flush to flash can occur more quickly than other requests. After the flush to flash is done, the four sectors 14, 15, 0, 1 of Q-R pointer table 232 are filled with 0,14,10, 0,15,10, 1,0,10, and 1,1,10.

Figure 16E:
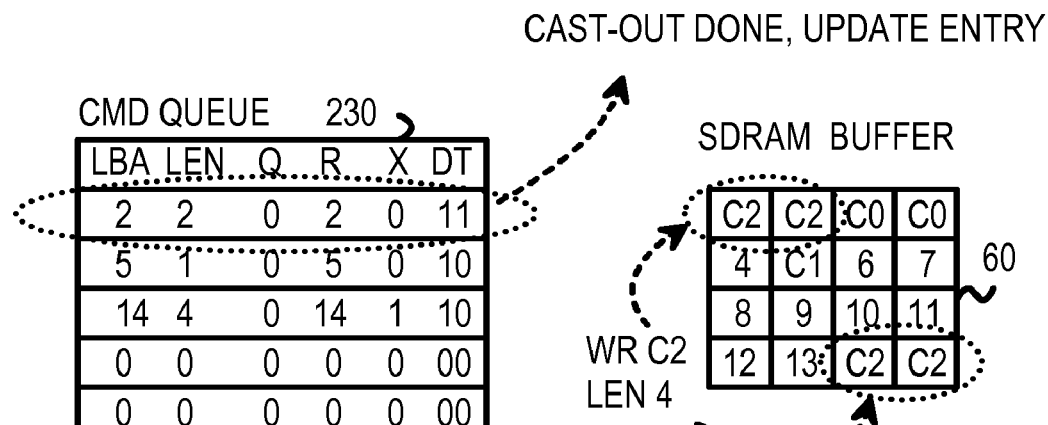

In FIG. 16E, the cast out of the old C0 data from sector 1 has completed. The first entry in command queue 230 is updated to account for sector 1 being cast out. The LBA is changed from 1 to 2, the remainder R is changed from 1 to 2, and the length reduced from 3 to 2. Thus the first entry in command queue 230 now covers 2 sectors of the old write C0 rather than 3. The data type is changed to read cache 11, since the other sectors 2, 3 were also copied to flash with the sector 1 cast out.

Now that the old C0 data in sector 1 has been cast out, the C2 write data from the host is written to sectors 14, 15, 0, 1 in sector data 234 of SDRAM 60 as shown in FIG. 16E.

Figure 16F:
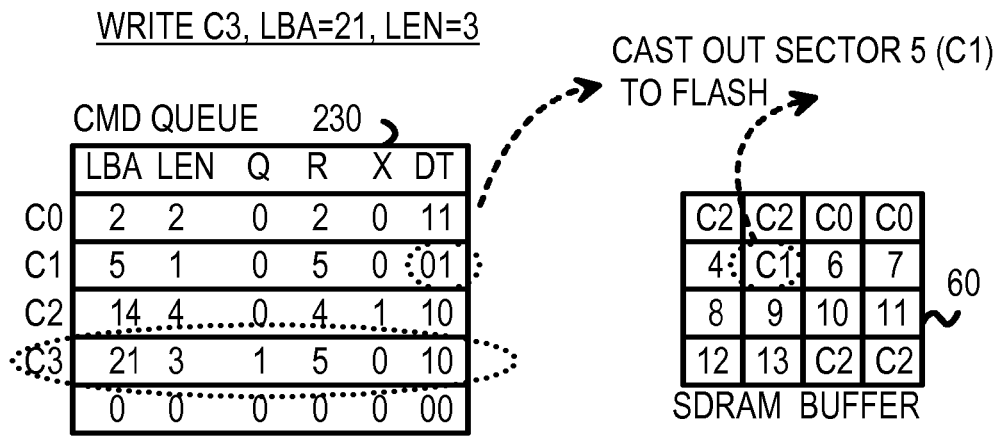

In FIG. 16F, the host writes C3 to LBA 21 for a length of 3 sectors. A fourth entry is loaded in command queue 230 for write C3, with LBA set to 21 and LEN set to 3. Since the LBA divided by 16 has a quotient Q of 1 and a remainder R of 5, 1,5 are stored for Q,R. The data type is set to 10, since the new C1 data will be dirty and not yet flushed to flash.

Figure 16G:
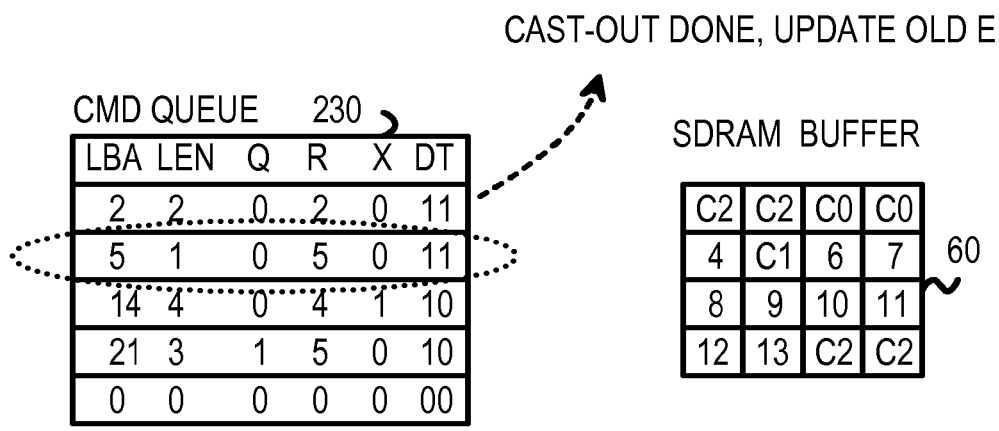

New data C3 is to be written to sectors 5, 6, 7 in SDRAM 60. These sectors are empty except for sector 5, which has the old C1 data that must be cast out to flash. The entry in command queue 230 for sector 5 has its data type changed to 01 to request an immediate write to flash. In FIG. 16G, once this cast out is completed, the data type is changed to 11, read cache, to indicate a clean line that has been copied to flash. The old C1 data is still present in sector 5 of sector data 234 in SDRAM 60.

Figure 16H:
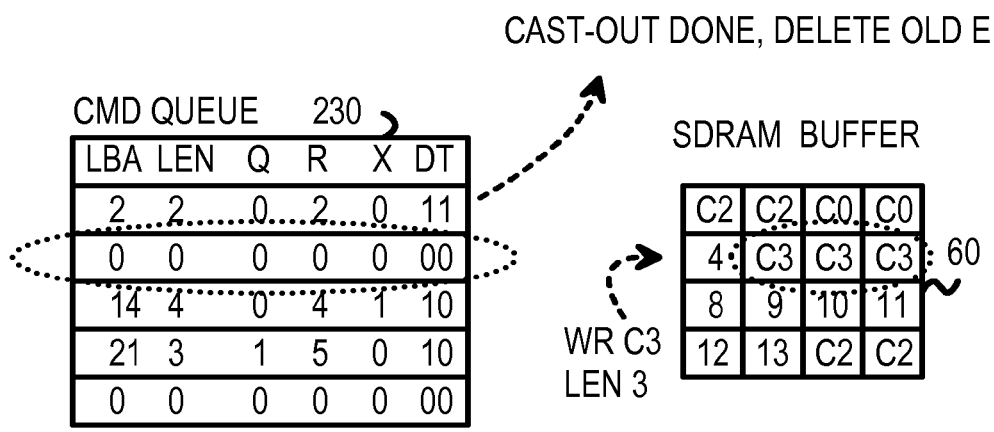

In FIG. 16H, the new C3 data is written to sectors 5, 6, 7 of sector data 234 in SDRAM 60. The old C1 data in sector 5 is overwritten, so its entry in command queue 230 has its data type changed to 00, empty. The old C1 entry can be cleared and later overwritten by a new host command. Sectors 5, 6, 7 of Q-R pointer table 232 are filled with 1,5,10, 1,6,10, and 1,7,10.

Figure 16I:
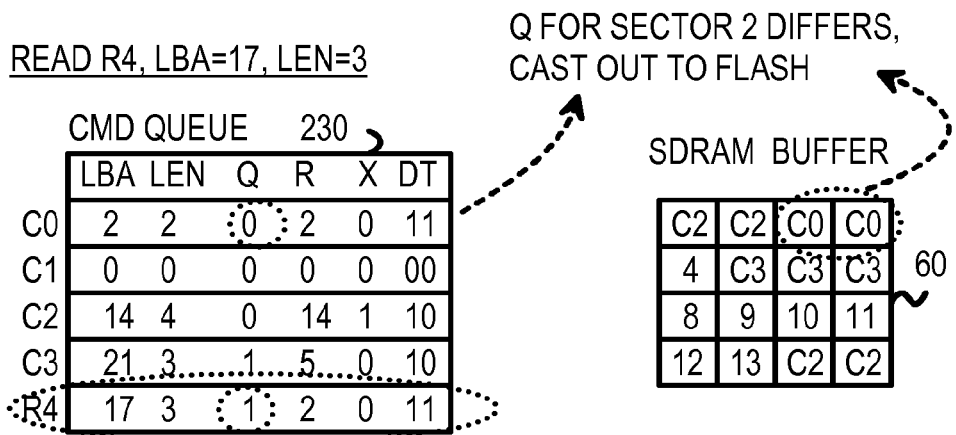

In FIG. 16I, the host reads R4 from LBA 17 for a length of 3 sectors. The LBA of 17 divided by the buffer size 16 produces a quotient of 1 and a remainder of 2. A new entry is allocated in command queue 230 for R4, with the data type set to read cache 11, since new clean data will be fetched from flash memory into sector data 234 of SDRAM 60.

Figure 16J:
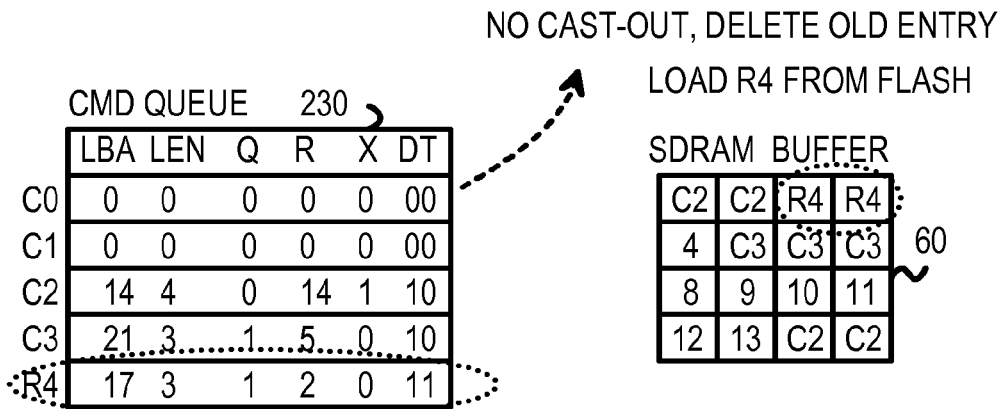

Location R=1 has the same Q of 1, and its data type is write cache 11 showing that the sector data is usable. Since location R=2 and 3 are already loaded with C0, and the first entry in command queue 230 shows a Q of 0, while the new Q is 1, the Q's mismatch. The host cannot read the old C0 data cached in sector data 234 of SDRAM 60. Instead, the old C0 data is cast out to flash. However, since the data type is already 11, the C0 data was already cast-out in FIG. 16D, so no cast out is needed. The old entry for C0 is invalidated, and the new data R4 is read from flash memory and written to sectors 1, 2, 3 in SDRAM 60 as shown in FIG. 16J.

Figure 16K:
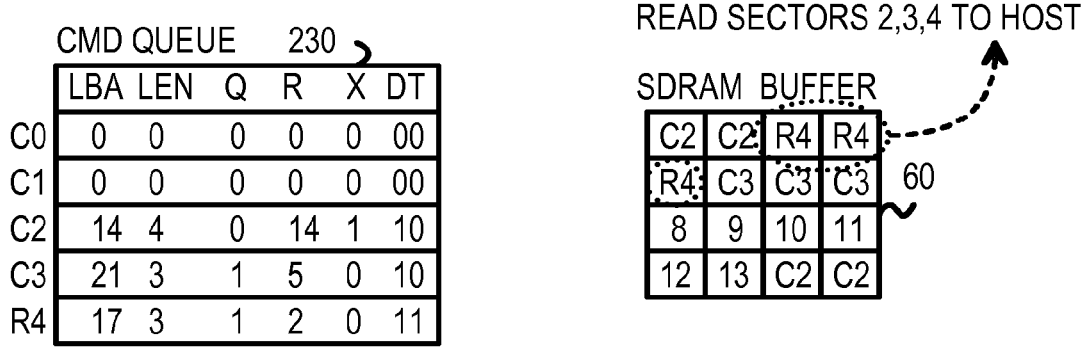

In FIG. 16K, the new data R4 is read from sectors 1, 2, 3 in sector data 234 of SDRAM 60 and sent to the host. The boundary-crossing flag X is set for entry R4 in command queue 230. Sectors 2, 3 of Q-R pointer table 232 are filled in with 1,2,11, and 1,3,11. Sector 1 remains the same.

Alternate Embodiments

Several other embodiments are contemplated by the inventors. For example, many variations of FIG. 1A and others are possible. A ROM such as an EEPROM could be connected to or part of virtual storage processor 140, or another virtual storage bridge 42 and NVM controller 76 could connect virtual storage processor 140 to another raw-NAND flash memory chip 68 that is dedicated to storing firmware for virtual storage processor 140. This firmware could also be stored in the main flash modules.

The flash memory may be embedded on a motherboard or SSD board or could be on separate modules. Capacitors, buffers, resistors, and other components may be added. Smart storage switch 30 may be integrated on the motherboard or on a separate board or module. NVM controller 76 can be integrated with smart storage switch 30 or with raw-NAND flash memory chips 68 as a single-chip device or a plug-in module or board.

Using a president-governor arrangement of controllers, the controllers in smart storage switch 30 may be less complex than would be required for a single level of control for wear-leveling, bad-block management, re-mapping, caching, power management, etc. Since lower-level functions are performed among raw-NAND flash memory chips 68 within each flash module 73 by NVM controllers 76 as a governor function, the president function in smart storage switch 30 can be simplified. Less expensive hardware may be used in smart storage switch 30, such as using an 8051 processor for virtual storage processor 140 or smart storage transaction manager 36, rather than a more expensive processor core such as a an Advanced RISC Machine ARM-9 CPU core.

Different numbers and arrangements of flash storage blocks can connect to the smart storage switch. Rather than use LBA buses 28 or differential serial packet buses 27, other serial buses such as synchronous Double-Data-Rate (DDR), a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

The transaction manager and its controllers and functions can be implemented in a variety of ways. Functions can be programmed and executed by a CPU or other processor, or can be implemented in dedicated hardware, firmware, or in some combination. Many partitionings of the functions can be substituted.

Overall system reliability is greatly improved by employing Parity/ECC with multiple NVM controllers 76, and distributing data segments into a plurality of NVM blocks. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the smart storage switch can initiate a "Fault Recovery" or "Auto-Rebuild" process to insert a new flash module, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the smart storage switch. Two or more internal buses can be used in the smart storage switch to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The smart switch can be integrated with other components or can be a stand-alone chip.

Additional pipeline or temporary buffers and FIFO's could be added. For example, a host FIFO in smart storage switch 30 may be may be part of smart storage transaction manager 36, or may be stored in SDRAM 60. Separate page buffers could be provided in each channel. The CLK_SRC shown in FIG. 2 is not necessary when raw-NAND flash memory chips 68 in flash modules 73 have an asynchronous interface.

A single package, a single chip, or a multi-chip package may contain one or more of the plurality of channels of flash memory and/or the smart storage switch.

A MLC-based flash module 73 may have four MLC flash chips with two parallel data channels, but different combinations may be used to form other flash modules 73, for example, four, eight or more data channels, or eight, sixteen or more MLC chips. The flash modules and channels may be in chains, branches, or arrays. For example, a branch of 4 flash modules 73 could connect as a chain to smart storage switch 30. Other size aggregation or partition schemes may be used for different access of the memory. Flash memory, a phase-change memory (PCM), or ferroelectric random-access memory (FRAM), Magnetoresistive RAM (MRAM), Memristor, PRAM, SONOS, Resistive RAM (RRAM), Racetrack memory, and nano RAM (NRAM) may be used.

The host can be a PC motherboard or other PC platform, a mobile communication device, a personal digital assistant (PDA), a digital camera, a combination device, or other device. The host bus or host-device interface can be SATA, PCIE, SD, USB, or other host bus, while the internal bus to flash module 73 can be PATA, multi-channel SSD using multiple SD/MMC, compact flash (CF), USB, or other interfaces in parallel. Flash module 73 could be a standard PCB or may be a multi-chip modules packaged in a TSOP, BGA, LGA, COB, PIP, SIP, CSP, POP, or Multi-Chip-Package (MCP) packages and may include raw-NAND flash memory chips 68 or raw-NAND flash memory chips 68 may be in separate flash chips. The internal bus may be fully or partially shared or may be separate buses. The SSD system may use a circuit board with other components such as LED indicators, capacitors, resistors, etc.

Directional terms such as upper, lower, up, down, top, bottom, etc. are relative and changeable as the system or data is rotated, flipped over, etc. These terms are useful for describing the device but are not intended to be absolutes.

Flash module 73 may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use smart storage switch 30 only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IRDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multi-level flash device comprising:
    a smart storage switch which comprises:
        an upstream interface to a host for receiving host commands to access non-volatile memory (NVM) and for receiving host data and a host address;
        a smart storage transaction manager that manages transactions from the host;
        a virtual storage processor that maps the host address to an assigned flash module to generate a logical block address (LBA), the virtual storage processor performing a first level of mapping;
        a virtual storage bridge between the smart storage transaction manager and a LBA bus;
    a NVM controller, coupled to the LBA bus to receive the LBA generated by the virtual storage processor and the host data from the virtual storage bridge;
    a second-level mapper, in the NVM controller, that maps the LBA to a physical block address (PBA);
    a plurality of flash modules that include the assigned flash module, wherein a flash module comprises:
        raw-NAND flash memory chips, coupled to the NVM controller, for storing the host data at a block location identified by the PBA generated by the second-level mapper in the NVM controller;
    a volatile memory buffer for temporarily storing the host data in a volatile memory that loses data when power is disconnected;
    wherein the raw-NAND flash memory chips in the plurality of flash module are non-volatile memory that retain data when power is disconnected;
    wherein the smart storage switch further comprises:
    a virtual buffer bridge, coupled between the smart storage transaction manager and the volatile memory buffer;
    a sector data buffer, in the volatile memory buffer, for temporarily caching the host data, the sector data buffer having L locations for storing the host data;
    a Q-R pointer table, in the volatile memory buffer, for storing a quotient Q and a remainder R generated by division of a host address by L;
    wherein Q, R, and L are whole numbers;
    wherein R identifies one of the L locations in the sector data buffer,
    whereby address mapping is performed at two levels to access the raw-NAND flash memory chips.

2. The multi-level flash device of claim 1 wherein the NVM controller is integrated on the flash module, wherein the flash module further comprises the NVM controller.

3. The multi-level flash device of claim 2 further comprising:
    a local clock source, within each of the plurality of flash modules, for generating local clocks for clocking the NVM controllers and interfaces to the raw-NAND flash memory chips,
    wherein local clocks are generated within each of the plurality of flash modules.

4. The multi-level flash device of claim 1 wherein the flash module is physically mounted to a host motherboard through a connector and socket, by direct solder attachment, or embedded within the host motherboard.

5. The multi-level flash device of claim 1 wherein the NVM controller is integrated with the smart storage switch.

6. The multi-level flash device of claim 1 wherein the smart storage switch further comprises:
    a data striping unit that divides the host data into data segments that are assigned to different ones of the plurality of flash modules;
    a parity generator for generating error detecting code for the host data, the error correcting code being stored with the host data,
    whereby error detection code is added at a top level by the smart storage switch.

7. The multi-level flash device of claim 1 further comprising:
    a command queue, in the volatile memory buffer, for storing entries for commands received from the host that have not yet written data to the raw-NAND flash memory chips.

8. The multi-level flash device of claim 7 further comprising:
    a data-type field in the command queue, the data-type field for prioritizing commands in the command queue, wherein the data-type field indicates an immediate cast-out operation of old host data in the sector data buffer that has a higher priority that other writes to flash memory;
    a cross-boundary flag in the command queue, the cross-boundary flag indicating when a host command transfers data to multiple locations in the sector data buffer that include a last location identified by a largest remainder R and a first location identified by a smallest remainder R.

9. A solid-state disk comprising:
    volatile memory buffer means for temporarily storing host data in a volatile memory that loses data when power is disconnected;
    smart storage switch means for switching host commands to a plurality of downstream devices, the smart storage switch means comprising:
        upstream interface means, coupled to a host, for receiving host commands to access flash memory and for receiving host data and a host address;
        smart storage transaction manager means for managing transactions from the host;

virtual storage processor means for translating the host address to an assigned flash module to generate a logical block address (LBA), the virtual storage processor means performing a first level of mapping;

virtual storage bridge means for transferring host data and the LBA between the smart storage transaction manager means and a LBA bus;

data striping means for dividing the host data into data segments that are assigned to different ones of the plurality of flash modules;

a plurality of flash modules that include the assigned flash module, wherein a flash module comprises:

lower-level controller means for controlling flash operations, coupled to the LBA bus to receive the LBA generated by the virtual storage processor means and the host data from the virtual storage bridge means;

second-level map means, in the lower-level controller means, for mapping the LBA to a physical block address (PBA); and raw-NAND flash memory chips, coupled to the lower-level controller means, for storing the host data at a block location identified by the PBA generated by the second-level map means in the lower-level controller means;

wherein the raw-NAND flash memory chips in the plurality of flash modules are non-volatile memory that retain data when power is disconnected;

sector data buffer means, in the volatile memory buffer means, for storing host data, the sector data buffer means having L locations for storing host data;

command queue means, in the volatile memory buffer means, for storing entries for commands received from the host that have not yet written data to the raw-NAND flash memory chips; and Q-R pointer table means, in the volatile memory buffer means, for storing a quotient Q and a remainder R generated by division of a host address by L;

wherein Q, R, and L are whole numbers;

wherein R identifies one of the L locations in the sector data buffer means, whereby address mapping is performed at two levels to access the raw-NAND flash memory chips.

10. The solid-state disk of claim 9 wherein the flash module comprises a flash module that is physically mounted to a host motherboard through a connector and socket, by direct solder attachment, or embedded within the host motherboard.

11. A solid-state disk comprising:

volatile memory buffer means for temporarily storing host data in a volatile memory that loses data when power is disconnected;

smart storage switch means for switching host commands to a plurality of downstream devices, the smart storage switch means comprising:

upstream interface means, coupled to a host, for receiving host commands to access flash memory and for receiving host data and a host address;

smart storage transaction manager means for managing transactions from the host;

virtual storage processor means for translating the host address to an assigned flash module to generate a logical block address (LBA), the virtual storage processor means performing a first level of mapping;

virtual storage bridge means for transferring host data and the LBA between the smart storage transaction manager means and a LBA bus;

data striping means for dividing the host data into data segments that are assigned to different ones of the plurality of flash modules;

a plurality of flash modules that include the assigned flash module, wherein a flash module comprises:

lower-level controller means for controlling flash operations, coupled to the LBA bus to receive the LBA generated by the virtual storage processor means and the host data from the virtual storage bridge means;

second-level map means, in the lower-level controller means, for mapping the LBA to a physical block address (PBA); and raw-NAND flash memory chips, coupled to the lower-level controller means, for storing the host data at a block location identified by the PBA generated by the second-level map means in the lower-level controller means;

wherein the raw-NAND flash memory chips in the plurality of flash modules are non-volatile memory that retain data when power is disconnected;

wherein the raw-NAND flash memory chips comprise two flash die that are stacked together and accessible by interleaving, and wherein each of the two flash die comprises two planes that are accessible by interleaving;

wherein a size of a data segment is equal to four pages per channel, and each channel has one of the plurality of flash modules, whereby the host data is striped with a depth to match the plurality of flash modules, whereby address mapping is performed at two levels to access the raw-NAND flash memory chips.

12. The solid-state disk of claim 11 wherein a stripe depth is equal to N times a stripe size, wherein N is a whole number of the plurality of flash modules, and wherein the stripe size is equal to a number of pages that can be simultaneously written into one of the plurality of flash modules.

13. The solid-state disk of claim 11 wherein the flash module comprises a flash module that is physically mounted to a host motherboard through a connector and socket, by direct solder attachment, or embedded within the host motherboard.

14. A striping non-volatile-memory (NVM) system comprising:

an upstream interface to a host that generates host data and host commands in a host sequence of commands;

a smart storage transaction manager, coupled to the upstream interface, for re-ordering the host commands from the host sequence into a reordered sequence of operations;

a plurality of NVM modules each having a plurality of NVM memory blocks for storing the host data in non-volatile solid-state memory that retains data when power is disconnected;

a virtual storage processor that assigns host commands to an assigned device in the plurality of NVM modules, the virtual storage processor also storing attributes obtained from each of the plurality of NVM modules, the attributes including memory capacities, wherein the virtual storage processor reports an aggregate sum of the memory capacities to the host;

a data striping unit for segmenting host data into data segments stored on several of the plurality of NVM modules;

a virtual storage bridge, coupled between the smart storage transaction manager and the plurality of NVM modules;

a lower-level controller for each of the plurality of NVM modules, the lower-level controller comprising:
    a remapping unit for converting logical addresses received from the virtual storage bridge into physical addresses for accessing the plurality of NVM memory blocks in the NVM module;
a dynamic-random-access memory (DRAM) buffer for temporarily storing the host data;
a virtual buffer bridge between the DRAM buffer and the smart storage transaction manager,
a sector data buffer, in the DRAM buffer, for temporarily caching the host data, the sector data buffer having L locations for storing the host data;
a Q-R pointer table, in the DRAM buffer, for storing a quotient Q and a remainder R generated by division of a host address by L;
wherein Q, R, and L are whole numbers;
wherein R identifies one of the L locations in the sector data buffer,
whereby high-level data striping is performed before the host data is sent to the plurality of NVM modules.

15. The striping non-volatile-memory system of claim 14 further comprising:
    a truncation process, activated on power-up, for determining a smallest size of the plurality of NVM modules, and for setting a size of all NVM modules in the plurality of NVM modules to the smallest size;
    wherein the NVM memory blocks comprises a flash memory, a phase-change memory (PCM), ferroelectric random-access memory (FRAM), Magnetoresistive RAM (MRAM), Memristor, PRAM, SONOS, Resistive RAM (RRAM), Racetrack memory, or nano RAM (NRAM).

16. The striping non-volatile-memory system of claim 15 further comprising:
    a command queue, in the DRAM buffer, for storing entries for commands received from the host that have not yet written data to the NVM memory blocks.

* * * * *